(12) United States Patent
Sampson et al.

(10) Patent No.: US 11,566,972 B2
(45) Date of Patent: Jan. 31, 2023

(54) TIRE TREAD GAUGE USING VISUAL INDICATOR

(71) Applicant: MIDTRONICS, INC., Willowbrook, IL (US)

(72) Inventors: William G. Sampson, Elmhurst, IL (US); Kevin I. Bertness, Batavia, IL (US)

(73) Assignee: MIDTRONICS, INC., Willowbrook, IL (US)

( * ) Notice: Subject to any disclaimer, the term of this patent is extended or adjusted under 35 U.S.C. 154(b) by 75 days.

(21) Appl. No.: 16/943,120

(22) Filed: Jul. 30, 2020

(65) Prior Publication Data

US 2021/0048374 A1    Feb. 18, 2021

Related U.S. Application Data

(60) Provisional application No. 62/880,782, filed on Jul. 31, 2019.

(51) Int. Cl.
*G01M 17/02* (2006.01)
*G01L 17/00* (2006.01)
(Continued)

(52) U.S. Cl.
CPC ........... *G01M 17/02* (2013.01); *B60C 11/243* (2013.01); *G01B 21/18* (2013.01); *G01L 17/00* (2013.01);
(Continued)

(58) Field of Classification Search
CPC ... B60C 23/0408; B60C 11/24; B60C 11/243; B60C 23/041; G01R 31/36;
(Continued)

(56) References Cited

U.S. PATENT DOCUMENTS

| 85,553 A | 1/1869 | Adams | 33/472 |
| 2,000,665 A | 5/1935 | Neal | 439/440 |

(Continued)

FOREIGN PATENT DOCUMENTS

| CN | 2470964 Y | 1/2002 |
| CN | 201063352 Y | 5/2008 |

(Continued)

OTHER PUBLICATIONS

"Electrochemical Impedance Spectroscopy in Battery Development and Testing", *Batteries International*, Apr. 1997, pp. 59 and 62-63.
(Continued)

*Primary Examiner* — Nimeshkumar D Patel
*Assistant Examiner* — Gedeon M Kidanu
(74) *Attorney, Agent, or Firm* — Westman, Champlin & Koehler, P.A.

(57) ABSTRACT

An electronic battery tester for testing a storage battery includes a Kelvin connection configured to electrically couple to the storage battery and a microprocessor configured to determine a dynamic parameter of the storage battery. A forcing function source is configured to apply a forcing function signal to the storage battery through the Kelvin connection. A sensor is electrically coupled to the storage battery and configured to sense an electrical response of the storage battery to the applied forcing function signal. A tire tread gauge is arranged to be inserted into a tread of a tire. The tire tread gauge including a visual indicator. An image capture device is configured to capture an image of the tire tread gauge when the tire tread gauge is inserted into the tread of the tire.

27 Claims, 6 Drawing Sheets

(51) Int. Cl.
   *G01B 21/18*     (2006.01)
   *G01R 31/364*    (2019.01)
   *B60C 11/24*     (2006.01)
   *G01L 19/00*     (2006.01)
   *B60R 16/023*    (2006.01)

(52) U.S. Cl.
   CPC ........ *G01L 19/0092* (2013.01); *G01R 31/364* (2019.01); *B60R 16/0234* (2013.01)

(58) Field of Classification Search
   CPC .............. G01R 31/3646; G01R 31/364; G01R 31/367; G01R 31/382; G01R 31/386; G01R 31/392; G01R 31/396; G01R 35/005; H01M 10/44; H01M 10/48; H01M 10/425; H01M 10/4257; H01M 10/482; H01M 2010/4271; H01M 2010/4278; H01M 2220/20; H02J 7/00; H02J 7/022; H02J 7/00309; H02J 7/0031; H02J 7/0047; H02J 7/0048; H02J 7/005; H02J 7/0069; Y02E 60/10; G08B 13/194; G01B 11/22; G01B 21/18; G01B 5/18; G01L 17/00; G01L 19/0092; G01M 17/02; G01M 17/027; B60L 2240/547; B60L 2250/16; B60L 3/0046; B60L 3/12; B60L 58/10; B60R 16/0234; B60W 20/13; B60Y 2200/91; B60Y 2200/92; Y02T 10/62; Y02T 10/70; Y02T 90/16; Y04S 10/126
   See application file for complete search history.

(56) References Cited

U.S. PATENT DOCUMENTS

| | | | |
|---|---|---|---|
| 2,254,846 A | 9/1941 | Heyer | 324/437 |
| 2,417,940 A | 3/1947 | Lehman | 200/61.25 |
| 2,437,772 A | 3/1948 | Wall | 324/523 |
| 2,514,745 A | 7/1950 | Dalzell | 324/115 |
| 2,727,221 A | 12/1955 | Springg | 340/447 |
| 3,025,455 A | 3/1962 | Jonsson | 323/369 |
| 3,178,686 A | 4/1965 | Mills | 340/447 |
| 3,215,194 A | 11/1965 | Sununu et al. | 165/80.3 |
| 3,223,969 A | 12/1965 | Alexander | 340/447 |
| 3,267,452 A | 8/1966 | Wolf | 340/249 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,699,433 A | 10/1972 | Smith, Jr. | 324/523 |
| 3,704,439 A | 11/1972 | Nelson | |
| 3,729,989 A | 5/1973 | Little | 73/862.192 |
| 3,745,441 A | 7/1973 | Soffer | 290/14 |
| 3,750,011 A | 7/1973 | Kreps | 324/430 |
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |
| 2,689,939 A | 4/1974 | Godshalk | |
| 3,808,401 A | 4/1974 | Wright et al. | |
| 3,808,522 A | 4/1974 | Sharaf | 324/430 |
| 3,808,573 A | 4/1974 | Cappell | |
| 3,811,089 A | 5/1974 | Strezelewicz | 324/170 |
| 3,816,805 A | 6/1974 | Terry | 320/123 |
| 3,850,490 A | 11/1974 | Zehr | 439/822 |
| 3,857,082 A | 12/1974 | Van Opijnen | 320/143 |
| 3,873,911 A | 3/1975 | Champlin | 324/430 |
| 3,876,931 A | 4/1975 | Godshalk | 324/429 |
| 3,879,654 A | 4/1975 | Kessinger | 324/434 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,920,284 A | 11/1975 | Lane et al. | 303/122.06 |
| 3,936,744 A | 2/1976 | Perlmutter | 324/772 |
| 3,939,400 A | 2/1976 | Steele | 324/434 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 3,997,830 A | 12/1976 | Newell et al. | 320/102 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,176,315 A | 11/1979 | Sunnarborg | 324/133 |
| 4,178,546 A | 12/1979 | Hulls et al. | 324/772 |
| 4,193,025 A | 3/1980 | Frailing et al. | 324/427 |
| 4,207,610 A | 6/1980 | Gordon | 701/33.9 |
| 4,207,611 A | 6/1980 | Gordon | 701/33 |
| 4,217,645 A | 8/1980 | Barry et al. | 702/63 |
| 4,218,745 A | 8/1980 | Perkins | 324/66 |
| 4,280,457 A | 7/1981 | Bloxham | 123/198 R |
| 4,295,468 A | 10/1981 | Bartelt | |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 340/636.11 |
| 4,322,685 A | 3/1982 | Frailing et al. | 324/429 |
| 4,351,405 A | 6/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,425,791 A | 1/1984 | Kling | 73/116.02 |
| 4,441,359 A | 4/1984 | Ezoe | 73/116.06 |
| 4,459,548 A | 7/1984 | Lentz et al. | 324/472 |
| 4,502,000 A | 2/1985 | Mashikian | |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,544,312 A | 10/1985 | Stencel | |
| 4,560,230 A | 12/1985 | Inglis | 439/890 |
| 4,564,798 A | 1/1986 | Young | 320/103 |
| 4,620,767 A | 11/1986 | Woolf | 439/217 |
| 4,626,765 A | 12/1986 | Tanaka | 320/127 |
| 4,633,418 A | 12/1986 | Bishop | 702/63 |
| 4,637,359 A | 1/1987 | Cook | 123/179 |
| 4,643,511 A | 2/1987 | Gawlik | 439/755 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |

(56) References Cited

U.S. PATENT DOCUMENTS

| | | | |
|---|---|---|---|
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/434 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| D299,909 S | 2/1989 | Casey | D10/77 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,826,457 A | 5/1989 | Varatta | 439/504 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A | 12/1989 | Koenck | 230/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,965,738 A | 10/1990 | Bauer et al. | 320/136 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,335 A | 8/1991 | Campbell | 439/217 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,083,076 A | 1/1992 | Scott | 320/105 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| D330,338 S | 10/1992 | Wang | D10/77 |
| 5,159,272 A | 10/1992 | Rao et al. | 324/429 |
| 5,160,881 A | 11/1992 | Schramm et al. | 322/7 |
| 5,164,653 A | 11/1992 | Reem | |
| 5,167,529 A | 12/1992 | Verge | 427/1 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,187,382 A | 2/1993 | Kondo | 307/10.1 |
| 5,194,799 A | 3/1993 | Tomantschger | 320/103 |
| 5,202,617 A | 4/1993 | Nor | |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,223,747 A | 6/1993 | Tschulena | 257/713 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,278,759 A | 1/1994 | Berra et al. | 701/1 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,296,823 A | 3/1994 | Dietrich | 333/161 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,309,052 A | 5/1994 | Kim | 174/350 |
| 5,313,152 A | 5/1994 | Wozniak et al. | 320/118 |
| 5,315,287 A | 5/1994 | Sol | 340/455 |
| 5,321,231 A | 6/1994 | Schmalzriedt et al. | |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |
| 5,325,041 A | 6/1994 | Briggs | 320/149 |
| 5,331,268 A | 7/1994 | Patino et al. | 320/158 |
| 5,332,927 A | 7/1994 | Paul et al. | 307/66 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,345,384 A | 9/1994 | Przybyla et al. | 701/29.1 |
| 5,347,163 A | 9/1994 | Yoshimura | 307/66 |
| 5,349,535 A | 9/1994 | Gupta | 320/106 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/160 |
| 5,365,453 A | 11/1994 | Startup et al. | 702/36 |
| 5,369,364 A | 11/1994 | Renirie et al. | 324/430 |
| 5,381,096 A | 1/1995 | Hirzel | 324/427 |
| 5,384,540 A | 1/1995 | Dessel | 324/539 |
| 5,387,871 A | 2/1995 | Tsai | 324/429 |
| 5,394,093 A | 2/1995 | Cervas | 324/556 |
| 5,402,007 A | 3/1995 | Center et al. | 290/40 B |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,425,041 A | 6/1995 | Seko et al. | 372/45.01 |
| 5,426,371 A | 6/1995 | Salley et al. | 324/429 |
| 5,426,416 A | 6/1995 | Jefferies et al. | 340/664 |
| 5,430,645 A | 7/1995 | Keller | 364/424.01 |
| 5,432,025 A | 7/1995 | Cox | 29/65 |
| 5,432,426 A | 7/1995 | Yoshida | 320/160 |
| 5,432,429 A | 7/1995 | Armstrong, II et al. | |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 324/430 |
| 5,459,660 A | 10/1995 | Berra | 701/33 |
| 5,462,439 A | 10/1995 | Keith | 180/279 |
| 5,469,043 A | 11/1995 | Cherng et al. | 320/161 |
| 5,485,090 A | 1/1996 | Stephens | 324/433 |
| 5,486,123 A | 1/1996 | Miyazaki | 439/825 |
| 5,488,300 A | 1/1996 | Jamieson | 324/432 |
| 5,504,674 A | 4/1996 | Chen et al. | 705/4 |
| 5,508,599 A | 4/1996 | Koenck | 320/138 |
| 5,519,383 A | 5/1996 | De La Rosa | 340/636.15 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,555,498 A | 9/1996 | Berra | |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |

(56) References Cited

U.S. PATENT DOCUMENTS

| | | | |
|---|---|---|---|
| 5,573,611 A | 11/1996 | Koch et al. | 152/152.1 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,416 A | 12/1996 | Audett et al. | 522/35 |
| 5,585,728 A | 12/1996 | Champlin | 324/427 |
| 5,589,292 A | 12/1996 | Rozon | |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,596,261 A | 1/1997 | Suyama | 320/152 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,631,536 A | 5/1997 | Tseng | 320/15 |
| 5,631,831 A | 5/1997 | Bird et al. | 701/34.4 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/156 |
| 5,644,212 A | 7/1997 | Takahashi | 320/134 |
| 5,650,937 A | 7/1997 | Bounaga | 702/65 |
| 5,652,501 A | 7/1997 | McClure et al. | 340/636.15 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 324/431 |
| 5,661,368 A | 8/1997 | Deol et al. | 315/82 |
| 5,666,040 A | 9/1997 | Bourbeau | 320/118 |
| 5,675,234 A | 10/1997 | Greene | 340/636.11 |
| 5,677,077 A | 10/1997 | Faulk | 429/90 |
| 5,684,678 A | 11/1997 | Barrett | 363/17 |
| 5,685,734 A | 11/1997 | Kutz | 439/371 |
| 5,691,621 A | 11/1997 | Phuoc et al. | 320/134 |
| 5,699,050 A | 12/1997 | Kanazawa | 340/636.13 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,712,795 A | 1/1998 | Layman et al. | 700/297 |
| 5,717,336 A | 2/1998 | Basell et al. | 324/430 |
| 5,717,937 A | 2/1998 | Fritz | 713/300 |
| 5,721,688 A | 2/1998 | Bramwell | 324/426 |
| 5,732,074 A | 3/1998 | Spaur et al. | 370/313 |
| 5,739,667 A | 4/1998 | Matsuda et al. | 320/128 |
| 5,744,962 A | 4/1998 | Alber et al. | 324/426 |
| 5,745,044 A | 4/1998 | Hyatt, Jr. et al. | 340/5.23 |
| 5,747,189 A | 5/1998 | Perkins | 429/91 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/426 |
| 5,760,587 A | 6/1998 | Harvey | 324/434 |
| 5,772,468 A | 6/1998 | Kowalski et al. | 439/506 |
| 5,773,962 A | 6/1998 | Nor | 320/134 |
| 5,773,978 A | 6/1998 | Becker | 324/430 |
| 5,778,326 A | 7/1998 | Moroto et al. | 701/22 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,811,979 A | 9/1998 | Rhein | 324/718 |
| 5,818,201 A | 10/1998 | Stockstad et al. | 320/119 |
| 5,818,234 A | 10/1998 | McKinnon | 324/433 |
| 5,820,407 A | 10/1998 | Morse et al. | 439/504 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,826,467 A | 10/1998 | Huang | |
| 5,831,435 A | 11/1998 | Troy | 324/426 |
| 5,832,396 A | 11/1998 | Moroto et al. | 701/22 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,869,951 A | 2/1999 | Takahashi | 320/104 |
| 5,870,018 A | 2/1999 | Person | 307/10.2 |
| 5,871,858 A | 2/1999 | Thomsen et al. | 429/7 |
| 5,872,443 A | 2/1999 | Williamson | 320/160 |
| 5,872,453 A | 2/1999 | Shimoyama et al. | 324/431 |
| 5,883,306 A | 3/1999 | Hwang | 73/146.8 |
| 5,884,202 A | 3/1999 | Arjomand | 701/31.4 |
| 5,895,440 A | 4/1999 | Proctor et al. | 702/63 |
| 5,903,154 A | 5/1999 | Zhang et al. | 324/437 |
| 5,903,716 A | 5/1999 | Kimber et al. | 395/114 |
| 5,912,534 A | 6/1999 | Benedict | 315/82 |
| 5,914,605 A | 6/1999 | Bertness | 324/430 |
| 5,916,287 A | 6/1999 | Arjomand et al. | 701/33.2 |
| 5,927,938 A | 7/1999 | Hammerslag | 414/809 |
| 5,929,609 A | 7/1999 | Joy et al. | 322/25 |
| 5,935,180 A | 8/1999 | Fieramosca et al. | 701/29.6 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,946,605 A | 8/1999 | Takahisa et al. | 455/68 |
| 5,950,144 A | 9/1999 | Hall et al. | 702/108 |
| 5,951,229 A | 9/1999 | Hammerslag | 414/398 |
| 5,953,322 A | 9/1999 | Kimball | 370/328 |
| 5,955,951 A | 9/1999 | Wischerop et al. | 340/572.8 |
| 5,961,561 A | 10/1999 | Wakefield, II | 701/29 |
| 5,961,604 A | 10/1999 | Anderson et al. | 709/229 |
| 5,963,012 A | 10/1999 | Garcia et al. | 320/106 |
| 5,969,625 A | 10/1999 | Russo | 340/636.19 |
| 5,973,598 A | 10/1999 | Beigel | 340/572.1 |
| 5,978,805 A | 11/1999 | Carson | 707/10 |
| 5,982,138 A | 11/1999 | Krieger | 320/105 |
| 5,990,664 A | 11/1999 | Rahman | 320/136 |
| 6,002,238 A | 12/1999 | Champlin | 320/134 |
| 6,005,489 A | 12/1999 | Siegle et al. | 340/825.69 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,009,742 A | 1/2000 | Balko | |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,745 A | 3/2000 | Koike et al. | 320/104 |
| 6,037,749 A | 3/2000 | Parsonage | 320/132 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,075,339 A | 6/2000 | Reipur et al. | 320/110 |
| 6,081,098 A | 6/2000 | Bertness et al. | 320/134 |
| 6,081,109 A | 6/2000 | Seymour et al. | 324/127 |
| 6,081,154 A | 6/2000 | Ezell et al. | 327/540 |
| 6,087,815 A | 7/2000 | Pfeifer et al. | 323/282 |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,097,193 A | 8/2000 | Bramwell | 324/429 |
| 6,100,670 A | 8/2000 | Levesque | 320/150 |
| 6,100,815 A | 8/2000 | Pailthorp | 324/754.07 |
| 6,104,167 A | 8/2000 | Bertness et al. | 320/132 |
| 6,113,262 A | 9/2000 | Purola et al. | 374/45 |
| 6,114,834 A | 9/2000 | Parise | 320/109 |
| 6,118,252 A | 9/2000 | Richter | |
| 6,121,880 A | 9/2000 | Scott et al. | 340/572.5 |
| 6,130,519 A | 10/2000 | Whiting et al. | |
| 6,136,914 A | 10/2000 | Hergenrother et al. | 524/495 |
| 6,137,261 A | 10/2000 | Kurle et al. | |
| 6,137,269 A | 10/2000 | Champlin | 320/150 |
| 6,140,797 A | 10/2000 | Dunn | 320/105 |
| 6,141,608 A | 10/2000 | Rother | 701/29.6 |
| 6,144,185 A | 11/2000 | Dougherty et al. | 320/132 |

(56) References Cited

U.S. PATENT DOCUMENTS

| | | | |
|---|---|---|---|
| 6,147,598 A | 11/2000 | Murphy et al. | 340/426.19 |
| 6,149,653 A | 11/2000 | Deslauriers | 606/232 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,164,063 A | 12/2000 | Mendler | 60/274 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,177,737 B1 | 1/2001 | Palfey et al. | 307/64 |
| 6,177,878 B1 | 1/2001 | Tamura | |
| 6,181,545 B1 | 1/2001 | Amatucci et al. | 361/502 |
| 6,184,655 B1 | 2/2001 | Malackowski | 320/116 |
| 6,184,656 B1 | 2/2001 | Karunasiri et al. | 320/119 |
| 6,191,557 B1 | 2/2001 | Gray et al. | 320/132 |
| 6,202,739 B1 | 3/2001 | Pal et al. | 165/104.33 |
| 6,211,651 B1 | 4/2001 | Nemoto | 320/133 |
| 6,211,653 B1 | 4/2001 | Stasko | 320/132 |
| 6,215,275 B1 | 4/2001 | Bean | 320/106 |
| 6,218,805 B1 | 4/2001 | Melcher | 320/105 |
| 6,218,936 B1 | 4/2001 | Imao | 340/447 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |
| 6,225,898 B1 | 5/2001 | Kamiya et al. | 340/505 |
| 6,235,186 B1 | 5/2001 | Helton et al. | 320/106 |
| 6,236,332 B1 | 5/2001 | Conkright et al. | 340/3.1 |
| 6,236,949 B1 | 5/2001 | Hart | 702/64 |
| 6,238,253 B1 | 5/2001 | Qualls | 439/759 |
| 6,242,887 B1 | 6/2001 | Burke | 320/104 |
| 6,242,921 B1 | 6/2001 | Thibedeau et al. | 324/429 |
| 6,249,124 B1 | 6/2001 | Bertness | 324/426 |
| 6,250,973 B1 | 6/2001 | Lowery et al. | 439/763 |
| 6,252,942 B1 | 6/2001 | Zoiss | 379/19 |
| 6,254,438 B1 | 7/2001 | Gaunt | 439/755 |
| 6,255,826 B1 | 7/2001 | Ohsawa | 320/116 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,262,692 B1 | 7/2001 | Babb | 343/895 |
| 6,263,268 B1 | 7/2001 | Nathanson | 701/29 |
| 6,263,322 B1 | 7/2001 | Kirkevold et al. | 705/400 |
| 6,271,643 B1 | 8/2001 | Becker et al. | 320/112 |
| 6,271,748 B1 | 8/2001 | Derbyshire et al. | 340/442 |
| 6,272,387 B1 | 8/2001 | Yoon | 700/83 |
| 6,275,008 B1 | 8/2001 | Arai et al. | 320/132 |
| 6,285,191 B1 | 9/2001 | Gollomp et al. | 324/427 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 320/132 |
| 6,316,914 B1 | 11/2001 | Bertness | 320/134 |
| 6,320,385 B1 | 11/2001 | Ng et al. | 320/104 |
| 6,323,650 B1 | 11/2001 | Bertness et al. | 324/426 |
| 6,324,042 B1 | 11/2001 | Andrews | 361/93.2 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,356,083 B1 | 3/2002 | Ying | 324/430 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,377,031 B1 | 4/2002 | Karuppana et al. | 323/220 |
| 6,384,608 B1 | 5/2002 | Namaky | 324/430 |
| 6,388,448 B1 | 5/2002 | Cervas | 324/426 |
| 6,389,337 B1 | 5/2002 | Kolls | 701/31.6 |
| 6,392,414 B2 | 5/2002 | Bertness | 324/429 |
| 6,396,278 B1 | 5/2002 | Makhija | 324/402 |
| 6,407,554 B1 | 6/2002 | Godau et al. | 324/503 |
| 6,411,098 B1 | 6/2002 | Laletin | 324/436 |
| 6,417,669 B1 | 7/2002 | Champlin | 324/426 |
| 6,420,852 B1 | 7/2002 | Sato | 320/134 |
| 6,424,157 B1 | 7/2002 | Gollomp et al. | 324/430 |
| 6,424,158 B2 | 7/2002 | Klang | 324/433 |
| 6,433,512 B1 | 8/2002 | Birkler et al. | 320/132 |
| 6,437,957 B1 | 8/2002 | Karuppana et al. | 361/78 |
| 6,441,585 B1 | 8/2002 | Bertness | 320/132 |
| 6,445,158 B1 | 9/2002 | Bertness et al. | 320/104 |
| 6,448,778 B1 | 9/2002 | Rankin | 324/503 |
| 6,449,726 B1 | 9/2002 | Smith | 713/340 |
| 6,456,036 B1 | 9/2002 | Thandiwe | 320/106 |
| 6,456,045 B1 | 9/2002 | Troy et al. | 320/139 |
| 6,465,908 B1 | 10/2002 | Karuppana et al. | 307/31 |
| 6,466,025 B1 | 10/2002 | Klang | 324/429 |
| 6,466,026 B1 | 10/2002 | Champlin | 324/430 |
| 6,469,511 B1 | 10/2002 | Vonderhaar et al. | 324/425 |
| 6,473,659 B1 | 10/2002 | Shah et al. | 700/79 |
| 6,477,478 B1 | 11/2002 | Jones et al. | 702/102 |
| 6,495,990 B2 | 12/2002 | Champlin | 320/132 |
| 6,497,209 B1 | 12/2002 | Karuppana et al. | 123/179.3 |
| 6,500,025 B1 | 12/2002 | Moenkhaus et al. | 439/502 |
| 6,501,243 B1 | 12/2002 | Kaneko | 318/139 |
| 6,505,507 B1 | 1/2003 | Imao et al. | 73/146.5 |
| 6,507,196 B2 | 1/2003 | Thomsen et al. | 324/436 |
| 6,526,361 B1 | 2/2003 | Jones et al. | 702/63 |
| 6,529,723 B1 | 3/2003 | Bentley | 455/405 |
| 6,531,847 B1 | 3/2003 | Tsukamoto et al. | |
| 6,531,848 B1 | 3/2003 | Chitsazan et al. | 320/153 |
| 6,532,425 B1 | 3/2003 | Boost et al. | 702/63 |
| 6,533,316 B2 | 3/2003 | Breed et al. | 280/735 |
| 6,534,992 B2 | 3/2003 | Meissner et al. | 324/426 |
| 6,534,993 B2 | 3/2003 | Bertness | 324/433 |
| 6,536,536 B1 | 3/2003 | Gass et al. | 173/2 |
| 6,544,078 B2 | 4/2003 | Palmisano et al. | 439/762 |
| 6,545,599 B2 | 4/2003 | Derbyshire et al. | 340/442 |
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,573,685 B2 | 6/2003 | Nakanishi et al. | |
| 6,577,107 B2 | 6/2003 | Kechmire | 320/139 |
| 6,586,941 B2 | 7/2003 | Bertness et al. | 324/426 |
| 6,597,150 B1 | 7/2003 | Bertness et al. | 320/104 |
| 6,599,243 B2 | 7/2003 | Woltermann et al. | 600/300 |
| 6,600,815 B1 | 7/2003 | Walding | 379/93.07 |
| 6,611,740 B2 | 8/2003 | Lowrey et al. | 701/29 |
| 6,614,349 B1 | 9/2003 | Proctor et al. | 340/572.1 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,624,635 B1 | 9/2003 | Lui | 324/426 |
| 6,628,011 B2 | 9/2003 | Droppo et al. | 307/43 |
| 6,629,054 B2 | 9/2003 | Makhija et al. | 702/113 |
| 6,633,165 B2 | 10/2003 | Bertness | 324/426 |
| 6,635,974 B1 | 10/2003 | Karuppana et al. | 307/140 |
| 6,636,790 B1 | 10/2003 | Lightner et al. | 701/31.5 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,732,031 B1 | 5/2004 | Lightner et al. | 701/31.4 |
| 6,736,941 B2 | 5/2004 | Oku et al. | 203/68 |
| 6,737,831 B2 | 5/2004 | Champlin | 320/132 |
| 6,738,697 B2 | 5/2004 | Breed | 701/29 |
| 6,740,990 B2 | 5/2004 | Tozuka et al. | 307/9.1 |
| 6,744,149 B1 | 6/2004 | Karuppana et al. | 307/31 |
| 6,745,153 B2 | 6/2004 | White et al. | 702/184 |
| 6,759,849 B2 | 7/2004 | Bertness et al. | 324/426 |
| 6,771,073 B2 | 8/2004 | Henningson et al. | 324/426 |
| 6,777,945 B2 | 8/2004 | Roberts et al. | 324/426 |
| 6,781,344 B1 | 8/2004 | Hedegor et al. | 320/106 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |

(56) References Cited

U.S. PATENT DOCUMENTS

| | | |
|---|---|---|
| 6,788,025 B2 | 9/2004 | Bertness et al. ............... 320/104 |
| 6,795,782 B2 | 9/2004 | Bertness et al. ................ 702/63 |
| 6,796,841 B1 | 9/2004 | Cheng et al. ............... 439/620.3 |
| 6,805,090 B2 | 10/2004 | Bertness et al. ................ 123/198 |
| 6,806,716 B2 | 10/2004 | Bertness et al. ............... 324/426 |
| 6,825,669 B2 | 11/2004 | Raichle et al. ............... 324/426 |
| 6,832,141 B2 | 12/2004 | Skeen et al. ................. 701/31.4 |
| 6,842,707 B2 | 1/2005 | Raichle et al. ................ 702/62 |
| 6,845,279 B1 | 1/2005 | Gilmore et al. .............. 700/115 |
| 6,850,037 B2 | 2/2005 | Bertness ....................... 320/132 |
| 6,856,162 B1 | 2/2005 | Greatorex et al. ........ 324/764.01 |
| 6,856,972 B1 | 2/2005 | Yun et al. ................... 705/36 R |
| 6,871,151 B2 | 3/2005 | Bertness ........................ 702/63 |
| 6,885,195 B2 | 4/2005 | Bertness ...................... 324/426 |
| 6,888,468 B2 | 5/2005 | Bertness .................. 340/636.15 |
| 6,891,378 B2 | 5/2005 | Bertness et al. ............... 324/426 |
| 6,895,809 B2 | 5/2005 | Raichle .......................... 73/119 |
| 6,904,796 B2 | 6/2005 | Pacsai et al. ................. 73/146.8 |
| 6,906,522 B2 | 6/2005 | Bertness et al. ............... 324/426 |
| 6,906,523 B2 | 6/2005 | Bertness et al. ............... 324/426 |
| 6,906,624 B2 | 6/2005 | McClelland et al. ......... 340/442 |
| 6,909,287 B2 | 6/2005 | Bertness ....................... 324/426 |
| 6,909,356 B2 | 6/2005 | Brown et al. ................. 340/3.2 |
| 6,911,825 B2 | 6/2005 | Namaky ....................... 324/426 |
| 6,913,483 B2 | 7/2005 | Restaino et al. .............. 439/504 |
| 6,914,413 B2 | 7/2005 | Bertness et al. ............... 320/104 |
| 6,919,725 B2 | 7/2005 | Bertness et al. ............... 324/433 |
| 6,930,485 B2 | 8/2005 | Bertness et al. ............... 324/426 |
| 6,933,727 B2 | 8/2005 | Bertness et al. ............... 324/426 |
| 6,941,234 B2 | 9/2005 | Bertness et al. ................ 702/63 |
| 6,957,133 B1 | 10/2005 | Hunt et al. .................. 701/32.4 |
| 6,961,445 B1 * | 11/2005 | Jensen ................. G08B 13/194 |
| | | 701/9 |
| 6,966,676 B2 | 11/2005 | Chabert et al. |
| 6,967,484 B2 | 11/2005 | Bertness ....................... 324/426 |
| 6,972,662 B1 | 12/2005 | Ohkawa et al. ............. 340/10.1 |
| 6,983,212 B2 | 1/2006 | Burns ............................ 702/63 |
| 6,988,053 B2 | 1/2006 | Namaky ....................... 320/104 |
| 6,993,421 B2 | 1/2006 | Pillar et al. .................. 701/29.4 |
| 6,998,847 B2 | 2/2006 | Bertness et al. ............... 324/426 |
| 7,003,410 B2 | 2/2006 | Bertness et al. ................ 702/63 |
| 7,003,411 B2 | 2/2006 | Bertness ........................ 702/63 |
| 7,012,433 B2 | 3/2006 | Smith et al. .................. 324/426 |
| 7,015,674 B2 | 3/2006 | Vonderhaar .................. 320/103 |
| 7,029,338 B1 | 4/2006 | Orange et al. ................ 439/755 |
| 7,034,541 B2 | 4/2006 | Bertness et al. ............... 324/426 |
| 7,039,533 B2 | 5/2006 | Bertness et al. ................ 702/63 |
| 7,042,346 B2 | 5/2006 | Paulsen ........................ 340/438 |
| 7,049,822 B2 | 5/2006 | Kung ........................... 324/426 |
| 7,058,525 B2 | 6/2006 | Bertness et al. ................ 702/63 |
| 7,069,979 B2 | 7/2006 | Tobias ..................... 165/104.33 |
| 7,081,755 B2 | 7/2006 | Klang et al. .................. 324/426 |
| 7,089,127 B2 | 8/2006 | Thibedeau et al. ............. 702/63 |
| 7,098,666 B2 | 8/2006 | Patino .......................... 324/433 |
| 7,102,556 B2 | 9/2006 | White .......................... 341/141 |
| 7,106,070 B2 | 9/2006 | Bertness et al. ............... 324/538 |
| 7,116,109 B2 | 10/2006 | Klang ........................... 324/426 |
| 7,119,686 B2 | 10/2006 | Bertness et al. ............ 340/572.1 |
| 7,120,488 B2 | 10/2006 | Nova et al. ...................... 600/2 |
| 7,126,341 B2 | 10/2006 | Bertness et al. ............... 324/426 |
| 7,129,706 B2 | 10/2006 | Kalley ......................... 324/426 |
| 7,154,276 B2 | 12/2006 | Bertness ...................... 324/503 |
| 7,170,393 B2 | 1/2007 | Martin ........................ 340/10.1 |
| 7,173,182 B2 | 2/2007 | Katsuyama .................... 174/36 |
| 7,177,925 B2 | 2/2007 | Carcido et al. ............... 709/223 |
| 7,182,147 B2 | 2/2007 | Cutler et al. ..................... 173/1 |
| 7,184,866 B2 | 2/2007 | Squires ................... 340/426.15 |
| 7,184,905 B2 | 2/2007 | Stefan ........................... 702/63 |
| 7,198,510 B2 | 4/2007 | Bertness ....................... 439/500 |
| 7,200,424 B2 | 4/2007 | Tischer et al. ................ 455/567 |
| 7,202,636 B2 | 4/2007 | Reynolds et al. ............. 320/166 |
| 7,208,914 B2 | 4/2007 | Klang ........................... 320/132 |
| 7,209,850 B2 | 4/2007 | Brott et al. ................... 324/426 |
| 7,209,860 B2 | 4/2007 | Trsar et al. ................... 702/183 |
| 7,212,887 B2 | 5/2007 | Shah et al. ................... 700/276 |
| 7,212,911 B2 | 5/2007 | Raichle et al. ................ 701/114 |
| 7,219,023 B2 | 5/2007 | Banke et al. ................... 702/58 |
| 7,233,128 B2 | 6/2007 | Brost et al. ................... 320/132 |
| 7,235,977 B2 | 6/2007 | Koran et al. .................. 324/426 |
| 7,246,015 B2 | 7/2007 | Bertness et al. ................ 702/63 |
| 7,251,551 B2 | 7/2007 | Mitsueda ......................... 700/2 |
| 7,272,519 B2 | 9/2007 | Lesesky et al. ................ 702/63 |
| 7,287,001 B1 | 10/2007 | Falls et al. ..................... 705/22 |
| 7,295,936 B2 | 11/2007 | Bertness et al. ................ 702/63 |
| 7,301,303 B1 | 11/2007 | Hulden ......................... 320/103 |
| 7,319,304 B2 | 1/2008 | Veloo et al. .................. 320/134 |
| 7,339,477 B2 | 3/2008 | Puzio et al. ............... 340/572.1 |
| 7,363,175 B2 | 4/2008 | Bertness et al. ................ 702/63 |
| 7,376,497 B2 | 5/2008 | Chen .......................... 701/31.6 |
| 7,398,176 B2 * | 7/2008 | Bertness .............. H01M 10/44 |
| | | 73/146 |
| 7,408,358 B2 | 8/2008 | Knopf .......................... 324/426 |
| 7,425,833 B2 | 9/2008 | Bertness et al. ............... 324/426 |
| 7,446,536 B2 | 11/2008 | Bertness ....................... 324/426 |
| 7,453,238 B2 | 11/2008 | Melichar ...................... 320/132 |
| 7,479,763 B2 | 1/2009 | Bertness ....................... 320/134 |
| 7,498,767 B2 | 3/2009 | Brown et al. ................. 320/107 |
| 7,501,795 B2 | 3/2009 | Bertness et al. ............... 320/134 |
| 7,504,830 B2 | 3/2009 | Keuss |
| 7,505,856 B2 | 3/2009 | Restaino et al. ................ 702/63 |
| 7,538,571 B2 | 5/2009 | Raichle et al. ................ 324/772 |
| 7,545,146 B2 | 6/2009 | Klang et al. .................. 324/426 |
| 7,557,586 B1 | 7/2009 | Vonderhaar et al. .......... 324/437 |
| 7,571,035 B2 | 8/2009 | Raichle |
| 7,590,476 B2 | 9/2009 | Shumate ...................... 701/31.6 |
| 7,592,776 B2 | 9/2009 | Tsukamoto et al. ........... 320/136 |
| 7,595,643 B2 | 9/2009 | Klang ........................... 324/426 |
| 7,596,437 B1 | 9/2009 | Hunt et al. |
| 7,598,699 B2 | 10/2009 | Restaino et al. .............. 320/105 |
| 7,598,743 B2 | 10/2009 | Bertness ....................... 324/426 |
| 7,598,744 B2 | 10/2009 | Bertness et al. ............... 324/426 |
| 7,619,417 B2 | 11/2009 | Klang ........................... 324/427 |
| 7,642,786 B2 | 1/2010 | Philbrook .................... 324/426 |
| 7,642,787 B2 | 1/2010 | Bertness et al. ............... 324/426 |
| 7,656,162 B2 | 2/2010 | Vonderhaar et al. .......... 324/426 |
| 7,657,386 B2 | 2/2010 | Thibedeau et al. ............. 702/63 |
| 7,667,437 B2 | 2/2010 | Johnson et al. ............... 320/150 |
| 7,679,325 B2 | 3/2010 | Seo .............................. 320/116 |
| 7,684,908 B1 | 3/2010 | Ogilvie et al. ............... 701/29.6 |
| 7,688,074 B2 | 3/2010 | Cox et al. ..................... 324/426 |
| 7,690,573 B2 | 4/2010 | Raichle et al. ................ 235/462 |
| 7,696,759 B2 | 4/2010 | Raichle et al. ................ 324/538 |
| 7,698,179 B2 | 4/2010 | Leung et al. ................... 705/28 |
| 7,705,602 B2 | 4/2010 | Bertness ....................... 324/426 |
| 7,706,991 B2 | 4/2010 | Bertness et al. ................ 702/63 |
| 7,706,992 B2 * | 4/2010 | Ricci .................. A61B 5/0006 |
| | | 375/240 |
| 7,710,119 B2 | 5/2010 | Bertness ....................... 324/426 |
| 7,723,993 B2 | 5/2010 | Klang ........................... 324/431 |
| 7,728,556 B2 | 6/2010 | Yano et al. ................... 320/134 |
| 7,728,597 B2 | 6/2010 | Bertness ...................... 324/426 |
| 7,729,880 B1 | 6/2010 | Mashburn ..................... 702/151 |
| 7,743,788 B2 | 6/2010 | Schmitt ........................ 137/554 |
| 7,751,953 B2 | 7/2010 | Namaky ....................... 701/33.2 |
| 7,772,850 B2 | 8/2010 | Bertness ....................... 324/426 |
| 7,774,130 B2 | 8/2010 | Pepper ......................... 340/439 |
| 7,774,151 B2 | 8/2010 | Bertness ........................ 702/63 |
| 7,777,612 B2 | 8/2010 | Sampson et al. .......... 340/426.1 |
| 7,791,348 B2 | 9/2010 | Brown et al. ................. 324/426 |
| 7,808,375 B2 | 10/2010 | Bertness et al. ............... 340/455 |
| 7,848,857 B2 | 12/2010 | Nasr et al. ...................... 701/22 |
| 7,883,002 B2 | 2/2011 | Jin et al. ....................... 235/376 |
| 7,902,990 B2 | 3/2011 | Delmonico et al. ....... 340/636.1 |
| 7,914,350 B1 | 3/2011 | Bozich ......................... 439/506 |
| 7,924,015 B2 | 4/2011 | Bertness ....................... 324/427 |
| 7,940,052 B2 | 5/2011 | Vonderhaar |
| 7,940,053 B2 | 5/2011 | Brown et al. ................. 324/426 |
| 7,959,476 B2 | 6/2011 | Smith et al. |
| 7,977,914 B2 | 7/2011 | Bertness |
| D643,759 S | 8/2011 | Bertness |
| 7,990,155 B2 | 8/2011 | Henningson .................. 324/429 |
| 7,999,505 B2 | 8/2011 | Bertness ....................... 320/104 |
| 8,024,083 B2 | 9/2011 | Chenn .............................. 701/2 |
| 8,047,868 B1 | 11/2011 | Korcynski ..................... 439/522 |

(56) References Cited

U.S. PATENT DOCUMENTS

| | | | |
|---|---|---|---|
| 8,164,343 B2 | 4/2012 | Bertness | 324/503 |
| 8,198,900 B2 | 6/2012 | Bertness et al. | |
| 8,203,345 B2 | 6/2012 | Bertness | |
| 8,222,868 B2 | 7/2012 | Buckner | 320/136 |
| 8,226,008 B2 | 7/2012 | Raichle et al. | 235/462.13 |
| 8,237,448 B2 * | 8/2012 | Bertness | H01M 10/44 324/426 |
| 8,306,690 B2 | 11/2012 | Bertness | 701/34.4 |
| 8,310,271 B2 | 11/2012 | Raichle et al. | 324/765.01 |
| 8,344,685 B2 | 1/2013 | Bertness et al. | |
| 8,436,619 B2 | 5/2013 | Bertness et al. | |
| 8,442,877 B2 | 5/2013 | Bertness et al. | |
| 8,449,560 B2 | 5/2013 | Roth | 227/175.1 |
| 8,493,022 B2 | 7/2013 | Bertness | |
| D687,727 S | 8/2013 | Kehoe et al. | |
| 8,509,212 B2 | 8/2013 | Sanjeev | |
| 8,513,949 B2 | 8/2013 | Bertness | |
| 8,594,957 B2 | 11/2013 | Gauthier | 324/548 |
| 8,674,654 B2 | 3/2014 | Bertness | |
| 8,674,711 B2 | 3/2014 | Bertness | |
| 8,704,483 B2 | 4/2014 | Bertness et al. | |
| 8,738,309 B2 | 5/2014 | Bertness | |
| 8,754,653 B2 | 6/2014 | Volderhaar et al. | |
| 8,810,200 B2 | 8/2014 | Kondo | |
| 8,825,272 B1 | 9/2014 | Chinnadurai | |
| 8,827,729 B2 | 9/2014 | Gunreben | 439/188 |
| 8,872,516 B2 | 10/2014 | Bertness | |
| 8,872,517 B2 | 10/2014 | Philbrook et al. | |
| 8,901,888 B1 | 12/2014 | Beckman | |
| 8,958,998 B2 | 2/2015 | Bertness | |
| 8,963,550 B2 | 2/2015 | Bertness et al. | |
| 9,018,958 B2 | 4/2015 | Bertness | |
| 9,037,394 B2 | 5/2015 | Fernandes | 701/400 |
| 9,052,366 B2 | 6/2015 | Bertness | |
| 9,056,556 B1 | 6/2015 | Hyde et al. | |
| 9,166,261 B2 | 10/2015 | Ibi | |
| 9,201,120 B2 | 12/2015 | Stukenburg | |
| 9,229,062 B2 | 1/2016 | Stukenberg | |
| 9,244,100 B2 | 1/2016 | Coleman et al. | |
| 9,255,955 B2 | 2/2016 | Bertness | 324/503 |
| 9,274,157 B2 | 3/2016 | Bertness | |
| 9,312,575 B2 | 4/2016 | Stukenberg | |
| 9,335,362 B2 | 5/2016 | Bertness | |
| 9,419,311 B2 | 8/2016 | Bertness | |
| 9,425,487 B2 | 8/2016 | Bertness | |
| 9,496,720 B2 | 11/2016 | McShane | |
| 9,588,185 B2 | 3/2017 | Champlin | |
| 9,639,899 B1 | 5/2017 | Gersitz | |
| 9,923,289 B2 | 3/2018 | Bertness | |
| 9,966,676 B2 | 5/2018 | Salo, III et al. | |
| 10,046,649 B2 | 8/2018 | Bertness | |
| 10,222,397 B2 | 3/2019 | Salo et al. | |
| 10,317,468 B2 | 6/2019 | Bertness | |
| 10,429,449 B2 | 10/2019 | Arnoldus | |
| 10,473,555 B2 | 11/2019 | Bertness | |
| 10,525,841 B2 | 1/2020 | Zhou et al. | |
| 10,608,353 B2 * | 3/2020 | Lipkin | H01R 11/24 |
| 10,843,574 B2 | 11/2020 | Palmisano et al. | |
| 11,054,480 B2 | 7/2021 | Bertness | |
| 11,325,479 B2 | 5/2022 | Bertness | |
| 2001/0012738 A1 | 8/2001 | Duperret | 439/835 |
| 2001/0033169 A1 | 10/2001 | Singh | 324/426 |
| 2001/0035737 A1 | 11/2001 | Nakanishi et al. | 320/122 |
| 2001/0048215 A1 | 12/2001 | Breed et al. | 280/728.1 |
| 2001/0048226 A1 | 12/2001 | Nada | 290/40 |
| 2002/0003423 A1 | 1/2002 | Bertness et al. | 324/426 |
| 2002/0004694 A1 | 1/2002 | McLeod et al. | 701/29 |
| 2002/0007237 A1 | 1/2002 | Phung et al. | 701/33 |
| 2002/0010558 A1 | 1/2002 | Bertness et al. | 702/63 |
| 2002/0021135 A1 | 2/2002 | Li et al. | 324/677 |
| 2002/0027346 A1 | 3/2002 | Breed et al. | 280/735 |
| 2002/0030495 A1 | 3/2002 | Kechmire | 324/427 |
| 2002/0036504 A1 | 3/2002 | Troy et al. | 324/430 |
| 2002/0041175 A1 | 4/2002 | Lauper et al. | 320/106 |
| 2002/0044050 A1 | 4/2002 | Derbyshire et al. | 340/442 |
| 2002/0047711 A1 | 4/2002 | Bertness et al. | 324/426 |
| 2002/0050163 A1 | 5/2002 | Makhija et al. | 73/116 |
| 2002/0065619 A1 | 5/2002 | Bertness | 702/63 |
| 2002/0074398 A1 | 6/2002 | Lancos et al. | 235/382 |
| 2002/0116140 A1 | 8/2002 | Rider | 702/63 |
| 2002/0118111 A1 | 8/2002 | Brown et al. | 340/573.1 |
| 2002/0121877 A1 | 9/2002 | Smith et al. | |
| 2002/0121901 A1 | 9/2002 | Hoffman | 324/426 |
| 2002/0128985 A1 | 9/2002 | Greenwald | 705/400 |
| 2002/0130665 A1 | 9/2002 | Bertness et al. | 324/426 |
| 2002/0152791 A1 | 10/2002 | Cardinale | |
| 2002/0153864 A1 | 10/2002 | Bertness | 320/132 |
| 2002/0171428 A1 | 11/2002 | Bertness | 702/63 |
| 2002/0176010 A1 | 11/2002 | Wallach et al. | 348/362 |
| 2002/0193955 A1 | 12/2002 | Bertness | 702/63 |
| 2003/0006779 A1 | 1/2003 | Youval | 324/503 |
| 2003/0009270 A1 | 1/2003 | Breed | 701/29 |
| 2003/0017753 A1 | 1/2003 | Palmisano et al. | 439/762 |
| 2003/0025481 A1 | 2/2003 | Bertness | 324/427 |
| 2003/0030442 A1 | 2/2003 | Sugimoto | 324/429 |
| 2003/0036909 A1 | 2/2003 | Kato | 704/275 |
| 2003/0040873 A1 | 2/2003 | Lesesky et al. | 702/57 |
| 2003/0060953 A1 | 3/2003 | Chen | 701/33 |
| 2003/0078743 A1 | 4/2003 | Bertness et al. | 702/63 |
| 2003/0088375 A1 | 5/2003 | Bertness et al. | 702/63 |
| 2003/0090272 A1 | 5/2003 | Bertness | 324/426 |
| 2003/0114206 A1 | 6/2003 | Timothy | 455/575.7 |
| 2003/0124417 A1 | 7/2003 | Bertness et al. | 429/90 |
| 2003/0128011 A1 | 7/2003 | Bertness et al. | |
| 2003/0128036 A1 | 7/2003 | Henningson et al. | 324/426 |
| 2003/0137277 A1 | 7/2003 | Mori et al. | 320/132 |
| 2003/0155930 A1 | 8/2003 | Thomsen | |
| 2003/0164073 A1 | 9/2003 | Chen | |
| 2003/0169018 A1 | 9/2003 | Berels et al. | 320/132 |
| 2003/0169019 A1 | 9/2003 | Oosaki | 320/132 |
| 2003/0171111 A1 | 9/2003 | Clark | 455/414.1 |
| 2003/0173971 A1 | 9/2003 | Bertness | 324/441 |
| 2003/0177417 A1 | 9/2003 | Malhotra et al. | 714/42 |
| 2003/0184262 A1 | 10/2003 | Makhija | 320/156 |
| 2003/0184264 A1 | 10/2003 | Bertness | |
| 2003/0184306 A1 | 10/2003 | Bertness et al. | 324/426 |
| 2003/0187556 A1 | 10/2003 | Suzuki | 701/29 |
| 2003/0194672 A1 | 10/2003 | Roberts et al. | 431/196 |
| 2003/0197512 A1 | 10/2003 | Miller et al. | 324/426 |
| 2003/0212311 A1 | 11/2003 | Nova et al. | 600/300 |
| 2003/0214395 A1 | 11/2003 | Flowerday et al. | 340/445 |
| 2003/0224241 A1 | 12/2003 | Takada et al. | 429/52 |
| 2003/0236656 A1 | 12/2003 | Dougherty | 703/14 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0000913 A1 | 1/2004 | Raichle et al. | 324/426 |
| 2004/0000915 A1 | 1/2004 | Raichle et al. | 324/522 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0032264 A1 | 2/2004 | Schoch | 324/426 |
| 2004/0036443 A1 | 2/2004 | Bertness | 320/109 |
| 2004/0044452 A1 | 3/2004 | Bauer et al. | 703/33 |
| 2004/0044454 A1 | 3/2004 | Ross et al. | 701/33 |
| 2004/0046564 A1 | 3/2004 | Klang | 324/426 |
| 2004/0049361 A1 | 3/2004 | Hamdan et al. | 702/115 |
| 2004/0051532 A1 | 3/2004 | Smith et al. | 324/426 |
| 2004/0051533 A1 | 3/2004 | Namaky | 324/426 |
| 2004/0051534 A1 | 3/2004 | Kobayashi et al. | 324/429 |
| 2004/0054503 A1 | 3/2004 | Namaky | 702/182 |
| 2004/0064225 A1 | 4/2004 | Jammu et al. | 701/29 |
| 2004/0065489 A1 | 4/2004 | Aberle | 180/65.1 |
| 2004/0088087 A1 | 5/2004 | Fukushima et al. | 701/32 |
| 2004/0104728 A1 | 6/2004 | Bertness et al. | 324/429 |
| 2004/0108855 A1 | 6/2004 | Raichle | 324/378 |
| 2004/0108856 A1 | 6/2004 | Johnson | 324/426 |
| 2004/0113494 A1 | 6/2004 | Karuppana et al. | |
| 2004/0113588 A1 | 6/2004 | Mikuriya et al. | 320/128 |
| 2004/0145342 A1 | 7/2004 | Lyon | 320/108 |
| 2004/0145371 A1 | 7/2004 | Bertness | 324/426 |
| 2004/0150494 A1 | 8/2004 | Yoshida | 333/243 |
| 2004/0157113 A1 | 8/2004 | Klang | 429/50 |
| 2004/0164706 A1 | 8/2004 | Osborne | 320/116 |

(56) References Cited

U.S. PATENT DOCUMENTS

| | | |
|---|---|---|
| 2004/0172177 A1 | 9/2004 | Nagai et al. .................. 701/29 |
| 2004/0178185 A1 | 9/2004 | Yoshikawa et al. .......... 219/270 |
| 2004/0189309 A1 | 9/2004 | Bertness et al. .............. 324/426 |
| 2004/0199343 A1 | 10/2004 | Cardinal et al. ................ 702/63 |
| 2004/0207367 A1 | 10/2004 | Taniguchi et al. ............ 320/149 |
| 2004/0221641 A1 | 11/2004 | Moritsugu ................... 73/23.31 |
| 2004/0227523 A1 | 11/2004 | Namaky ........................ 324/537 |
| 2004/0239332 A1 | 12/2004 | Mackel et al. ................. 324/426 |
| 2004/0251876 A1 | 12/2004 | Bertness et al. .............. 320/136 |
| 2004/0251907 A1 | 12/2004 | Kalley |
| 2004/0257084 A1 | 12/2004 | Restaino ........................ 324/400 |
| 2005/0007068 A1 | 1/2005 | Johnson et al. ............... 320/110 |
| 2005/0009122 A1 | 1/2005 | Whelan et al. .............. 435/7.32 |
| 2005/0017726 A1 | 1/2005 | Koran et al. ................... 324/433 |
| 2005/0017952 A1 | 1/2005 | His ................................ 345/169 |
| 2005/0021197 A1 | 1/2005 | Zimmerman ................. 701/31.4 |
| 2005/0021294 A1 | 1/2005 | Trsar et al. .................... 702/183 |
| 2005/0021475 A1 | 1/2005 | Bertness ......................... 705/63 |
| 2005/0025299 A1 | 2/2005 | Tischer et al. ................. 379/199 |
| 2005/0035752 A1 | 2/2005 | Bertness |
| 2005/0043868 A1 | 2/2005 | Mitcham .......................... 701/29 |
| 2005/0057256 A1 | 3/2005 | Bertness ........................ 324/426 |
| 2005/0060070 A1 | 3/2005 | Kapolka et al. ................. 701/29 |
| 2005/0073314 A1 | 4/2005 | Bertness et al. ............... 324/433 |
| 2005/0076381 A1 | 4/2005 | Gross ............................. 725/107 |
| 2005/0077904 A1 | 4/2005 | Bertness ........................ 324/426 |
| 2005/0096809 A1 | 5/2005 | Skeen et al. ...................... 701/29 |
| 2005/0099185 A1 | 5/2005 | Klang |
| 2005/0102073 A1 | 5/2005 | Ingram ............................ 701/29 |
| 2005/0119809 A1 | 6/2005 | Chen ............................. 701/33.5 |
| 2005/0128083 A1 | 6/2005 | Puzio et al. ................. 340/572.1 |
| 2005/0128902 A1 | 6/2005 | Tsai ............................ 369/44.32 |
| 2005/0133245 A1 | 6/2005 | Katsuyama ................... 174/74 R |
| 2005/0134282 A1 | 6/2005 | Averbuch ...................... 324/426 |
| 2005/0143882 A1 | 6/2005 | Umezawa ........................ 701/29 |
| 2005/0159347 A1 | 7/2005 | Shah et al. ..................... 700/276 |
| 2005/0162172 A1 | 7/2005 | Bertness ........................ 324/426 |
| 2005/0168226 A1 | 8/2005 | Quint et al. ................... 324/426 |
| 2005/0173142 A1 | 8/2005 | Cutler et al. ................... 173/181 |
| 2005/0182536 A1 | 8/2005 | Doyle et al. .................... 701/29 |
| 2005/0184732 A1 | 8/2005 | Restaino ........................ 324/426 |
| 2005/0192045 A1 | 9/2005 | Lowles |
| 2005/0206346 A1 | 9/2005 | Smith et al. |
| 2005/0212521 A1 | 9/2005 | Bertness et al. .............. 324/426 |
| 2005/0213874 A1 | 9/2005 | Kline .............................. 385/15 |
| 2005/0218902 A1 | 10/2005 | Restaino et al. .............. 324/433 |
| 2005/0231205 A1 | 10/2005 | Bertness et al. .............. 324/426 |
| 2005/0254106 A9 | 11/2005 | Silverbrook et al. .......... 358/539 |
| 2005/0256617 A1 | 11/2005 | Cawthorne et al. ............ 701/22 |
| 2005/0258241 A1 | 11/2005 | McNutt et al. ................ 235/385 |
| 2005/0264296 A1 | 12/2005 | Philbrook ...................... 324/433 |
| 2005/0269880 A1 | 12/2005 | Konishi ........................ 307/10.7 |
| 2005/0273218 A1 | 12/2005 | Breed ............................... 701/2 |
| 2006/0012330 A1 | 1/2006 | Okumura et al. ............. 320/103 |
| 2006/0017447 A1 | 1/2006 | Bertness et al. .............. 324/538 |
| 2006/0026017 A1 | 2/2006 | Walder ......................... 701/31.4 |
| 2006/0030980 A1 | 2/2006 | St. Denis ........................ 701/29 |
| 2006/0038572 A1 | 2/2006 | Philbrook |
| 2006/0043976 A1 | 3/2006 | Gervais ......................... 324/508 |
| 2006/0061469 A1 | 3/2006 | Jaeger ........................ 340/539.13 |
| 2006/0076923 A1 | 4/2006 | Eaves ............................ 320/112 |
| 2006/0079203 A1 | 4/2006 | Nicolini ......................... 455/411 |
| 2006/0089767 A1 | 4/2006 | Sowa .............................. 701/29 |
| 2006/0090554 A1 | 5/2006 | Krampitz |
| 2006/0090555 A1 | 5/2006 | Krampitz |
| 2006/0091597 A1 | 5/2006 | Opsahl |
| 2006/0092584 A1 | 5/2006 | Raichle |
| 2006/0095230 A1 | 5/2006 | Grier et al. .................... 702/183 |
| 2006/0102397 A1 | 5/2006 | Buck ............................. 429/432 |
| 2006/0125482 A1 | 6/2006 | Klang |
| 2006/0136119 A1 | 6/2006 | Raichle |
| 2006/0139167 A1 | 6/2006 | Davie |
| 2006/0152224 A1 | 7/2006 | Kim et al. ..................... 324/430 |
| 2006/0155439 A1 | 7/2006 | Slawinski .................... 701/33.4 |
| 2006/0161313 A1 | 7/2006 | Rogers et al. ................... 701/1 |
| 2006/0161390 A1 | 7/2006 | Namaky et al. ............... 702/183 |
| 2006/0217914 A1* | 9/2006 | Bertness ................. G01R 31/36 |
| | | 702/113 |
| 2006/0244423 A1* | 11/2006 | Henningson ......... G01R 31/386 |
| | | 320/150 |
| 2006/0244457 A1 | 11/2006 | Henningson et al. ........ 324/426 |
| 2006/0282227 A1 | 12/2006 | Bertness |
| 2006/0282323 A1 | 12/2006 | Walker et al. ................... 705/14 |
| 2007/0005201 A1 | 1/2007 | Chenn ......................... 701/31.5 |
| 2007/0024460 A1 | 2/2007 | Clark ............................. 340/663 |
| 2007/0026916 A1 | 2/2007 | Juds et al. ......................... 463/1 |
| 2007/0046261 A1 | 3/2007 | Porebski ....................... 320/132 |
| 2007/0082652 A1 | 4/2007 | Hartigan |
| 2007/0088472 A1 | 4/2007 | Ganzhorn et al. .............. 701/33 |
| 2007/0108942 A1 | 5/2007 | Johnson et al. ............... 320/112 |
| 2007/0159177 A1 | 7/2007 | Bertness et al. .............. 324/426 |
| 2007/0182576 A1 | 8/2007 | Proska et al. ............... 340/636.1 |
| 2007/0194791 A1 | 8/2007 | Huang ........................... 324/430 |
| 2007/0194793 A1 | 8/2007 | Bertness ....................... 324/503 |
| 2007/0205752 A1 | 9/2007 | Leigh ............................ 324/500 |
| 2007/0205983 A1 | 9/2007 | Naimo ........................... 345/160 |
| 2007/0210801 A1 | 9/2007 | Krampitz ...................... 324/426 |
| 2007/0244660 A1 | 10/2007 | Bertness |
| 2007/0259256 A1 | 11/2007 | Le Canut et al. ............... 429/90 |
| 2007/0279066 A1 | 12/2007 | Chism ........................... 324/437 |
| 2008/0023547 A1 | 1/2008 | Raichle ..................... 235/462.13 |
| 2008/0036421 A1 | 2/2008 | Seo et al. ...................... 320/132 |
| 2008/0053716 A1 | 3/2008 | Scheucher ...................... 180/2.1 |
| 2008/0059014 A1 | 3/2008 | Nasr et al. ....................... 701/22 |
| 2008/0064559 A1 | 3/2008 | Cawthorne ....................... 477/5 |
| 2008/0086246 A1 | 4/2008 | Bolt et al. ....................... 701/29 |
| 2008/0087479 A1 | 4/2008 | Kang |
| 2008/0094068 A1 | 4/2008 | Scott ............................. 324/426 |
| 2008/0103656 A1 | 5/2008 | Lipscomb .................... 701/33.4 |
| 2008/0106267 A1 | 5/2008 | Bertness ....................... 320/112 |
| 2008/0169818 A1 | 7/2008 | Lesesky et al. ............... 324/426 |
| 2008/0179122 A1 | 7/2008 | Sugawara ................... 180/65.245 |
| 2008/0194984 A1 | 8/2008 | Keefe ............................ 600/559 |
| 2008/0256815 A1* | 10/2008 | Schafer ................. G01B 11/22 |
| | | 33/739 |
| 2008/0303528 A1 | 12/2008 | Kim ............................... 324/430 |
| 2008/0303529 A1 | 12/2008 | Nakamura et al. ........... 324/433 |
| 2008/0315830 A1 | 12/2008 | Bertness ....................... 320/104 |
| 2009/0006476 A1 | 1/2009 | Andreasen et al. ........ 707/104.1 |
| 2009/0011327 A1 | 1/2009 | Okumura et al. ............... 429/99 |
| 2009/0013521 A1 | 1/2009 | Okumura et al. ............... 29/730 |
| 2009/0024266 A1 | 1/2009 | Bertness et al. ................. 701/22 |
| 2009/0024419 A1 | 1/2009 | McClellan ........................ 705/4 |
| 2009/0085571 A1* | 4/2009 | Bertness ............. B60C 23/0408 |
| | | 324/426 |
| 2009/0146610 A1 | 6/2009 | Trigiani |
| 2009/0146800 A1 | 6/2009 | Grimlund et al. ............. 340/505 |
| 2009/0160395 A1 | 6/2009 | Chen ............................. 320/101 |
| 2009/0184165 A1 | 7/2009 | Bertness et al. |
| 2009/0198372 A1 | 8/2009 | Hammerslag ................. 700/226 |
| 2009/0203247 A1 | 8/2009 | Fifelski ......................... 439/345 |
| 2009/0237029 A1 | 9/2009 | Andelfinger .................. 320/108 |
| 2009/0237086 A1 | 9/2009 | Andelfinger .................. 324/431 |
| 2009/0247020 A1 | 10/2009 | Gathman et al. ............. 439/759 |
| 2009/0251151 A1 | 10/2009 | Miyashita |
| 2009/0259432 A1 | 10/2009 | Liberty ......................... 702/150 |
| 2009/0265121 A1 | 10/2009 | Rocci .............................. 702/57 |
| 2009/0273451 A1 | 11/2009 | Soppera et al. |
| 2009/0276115 A1 | 11/2009 | Chen ............................... 701/32 |
| 2009/0311919 A1 | 12/2009 | Smith ............................ 439/759 |
| 2010/0023198 A1 | 1/2010 | Hamilton ........................ 701/29 |
| 2010/0039065 A1 | 2/2010 | Kinkade ........................ 320/104 |
| 2010/0052193 A1 | 3/2010 | Sylvester ........................ 261/26 |
| 2010/0066283 A1 | 3/2010 | Kitanaka ................... 318/400.02 |
| 2010/0088050 A1 | 4/2010 | Keuss .............................. 702/63 |
| 2010/0094496 A1 | 4/2010 | Hershkovitz et al. |
| 2010/0117603 A1 | 5/2010 | Makhija ........................ 320/162 |
| 2010/0145780 A1 | 6/2010 | Nishikawa et al. ......... 705/14.11 |
| 2010/0214055 A1 | 8/2010 | Fuji ................................ 340/3.1 |
| 2010/0265131 A1 | 10/2010 | Fabius |
| 2010/0314950 A1 | 12/2010 | Rutkowski et al. ........... 307/125 |
| 2011/0004427 A1 | 1/2011 | Gorbold et al. ................. 702/63 |
| 2011/0015815 A1 | 1/2011 | Bertness ......................... 701/22 |
| 2011/0106280 A1 | 5/2011 | Zeier .............................. 700/90 |

(56) References Cited

U.S. PATENT DOCUMENTS

| | | |
|---|---|---|
| 2011/0127960 A1 | 6/2011 | Plett |
| 2011/0161025 A1 | 6/2011 | Tomura .................. 702/63 |
| 2011/0215767 A1 | 9/2011 | Johnson et al. ........ 320/136 |
| 2011/0218747 A1 | 9/2011 | Bertness ................. 702/63 |
| 2011/0258112 A1 | 10/2011 | Eder et al. |
| 2011/0265025 A1 | 10/2011 | Bertness |
| 2011/0267067 A1 | 11/2011 | Bertness et al. |
| 2011/0273181 A1 | 11/2011 | Park et al. ............. 324/429 |
| 2011/0294367 A1 | 12/2011 | Moon ..................... 439/878 |
| 2011/0300416 A1 | 12/2011 | Bertness |
| 2012/0041697 A1 | 2/2012 | Stukenberg ............ 702/63 |
| 2012/0046807 A1 | 2/2012 | Ruther ................... 701/2 |
| 2012/0046824 A1 | 2/2012 | Ruther et al. .......... 701/31.5 |
| 2012/0062237 A1 | 3/2012 | Robinson ............... 324/433 |
| 2012/0074904 A1 | 3/2012 | Rutkowski et al. .... 320/112 |
| 2012/0086399 A1 | 4/2012 | Choi |
| 2012/0116391 A1 | 5/2012 | Houser ................... 606/41 |
| 2012/0182132 A1 | 7/2012 | McShane |
| 2012/0249069 A1 | 10/2012 | Ohtomo .................. 320/109 |
| 2012/0256494 A1 | 10/2012 | Kesler .................... 307/104 |
| 2012/0256568 A1 | 10/2012 | Lee ........................ 318/139 |
| 2012/0274331 A1 | 11/2012 | Liu ......................... 324/426 |
| 2012/0293372 A1 | 11/2012 | Amendolare ........... 342/451 |
| 2013/0099747 A1 | 4/2013 | Baba ...................... 310/118 |
| 2013/0106362 A1 | 5/2013 | Mackintosh et al. |
| 2013/0106596 A1 | 5/2013 | Mouchet |
| 2013/0115821 A1 | 5/2013 | Golko .................... 439/638 |
| 2013/0134926 A1 | 5/2013 | Yoshida |
| 2013/0158782 A1 | 6/2013 | Bertness et al. ........ 701/34.4 |
| 2013/0172019 A1 | 7/2013 | Youssef .................. 455/456.6 |
| 2013/0200855 A1 | 8/2013 | Christensen et al. |
| 2013/0218781 A1 | 8/2013 | Simon |
| 2013/0288706 A1 | 10/2013 | Yu ......................... 455/456.1 |
| 2013/0297247 A1 | 11/2013 | Jardine |
| 2013/0311124 A1 | 11/2013 | Van Bremen .......... 702/104 |
| 2013/0314041 A1 | 11/2013 | Proebstle ............... 320/109 |
| 2013/0325405 A1 | 12/2013 | Miller |
| 2014/0002021 A1 | 1/2014 | Bertness |
| 2014/0002094 A1 | 1/2014 | Champlin ............... 324/426 |
| 2014/0029308 A1 | 1/2014 | Cojocaru ................ 363/13 |
| 2014/0081527 A1 | 3/2014 | Miller |
| 2014/0099830 A1 | 4/2014 | Byrne ..................... 439/638 |
| 2014/0117997 A1 | 5/2014 | Bertness ................. 324/426 |
| 2014/0145670 A1 | 5/2014 | van Zwam et al. |
| 2014/0194084 A1 | 7/2014 | Noonan .................. 455/404.1 |
| 2014/0225622 A1 | 8/2014 | Kudo ..................... 324/433 |
| 2014/0239964 A1 | 8/2014 | Gach ...................... 324/433 |
| 2014/0260577 A1 | 9/2014 | Chinnadurai |
| 2014/0266061 A1 | 9/2014 | Wachal |
| 2014/0278159 A1 | 9/2014 | Chinnadurai |
| 2014/0354237 A1 | 12/2014 | Cotton |
| 2014/0368156 A1 | 12/2014 | Aloe |
| 2014/0374475 A1 | 12/2014 | Kallfelz et al. |
| 2015/0093922 A1 | 4/2015 | Bosscher ................ 439/39 |
| 2015/0115720 A1 | 4/2015 | Hysell .................... 307/65 |
| 2015/0166518 A1 | 6/2015 | Boral et al. |
| 2015/0168499 A1 | 6/2015 | Palmisano |
| 2015/0221135 A1 | 8/2015 | Hill ........................ 345/633 |
| 2015/0239365 A1 | 8/2015 | Hyde et al. |
| 2015/0353192 A1 | 12/2015 | Morrison |
| 2016/0011271 A1 | 1/2016 | Bertness |
| 2016/0091571 A1 | 3/2016 | Salo, III |
| 2016/0154044 A1 | 6/2016 | Bertness |
| 2016/0171799 A1 | 6/2016 | Bertness |
| 2016/0216335 A1 | 7/2016 | Bertness |
| 2016/0232736 A1 | 8/2016 | Holtappels |
| 2016/0238667 A1 | 8/2016 | Palmisano et al. |
| 2016/0253852 A1 | 9/2016 | Bertness et al. |
| 2016/0266212 A1 | 9/2016 | Carlo |
| 2016/0285284 A1 | 9/2016 | Matlapudi et al. |
| 2016/0321897 A1 | 11/2016 | Lee |
| 2016/0336623 A1 | 11/2016 | Nayar |
| 2017/0093056 A1 | 3/2017 | Salo, III et al. |
| 2017/0146602 A1 | 5/2017 | Samp |
| 2017/0158058 A1 | 6/2017 | Lee et al. |
| 2017/0246916 A1 * | 8/2017 | Rhoades ............. G01M 17/027 |
| 2017/0373410 A1 | 12/2017 | Lipkin et al. |
| 2018/0009328 A1 | 1/2018 | Hinterberger et al. |
| 2018/0113171 A1 | 4/2018 | Bertness |
| 2018/0306867 A1 | 10/2018 | Bertness |
| 2019/0105998 A1 | 4/2019 | Bertness |
| 2019/0152332 A1 | 5/2019 | Bertness |
| 2019/0154763 A1 | 5/2019 | Bertness |
| 2019/0204392 A1 | 7/2019 | Bertness |
| 2020/0086757 A1 | 3/2020 | Vain et al. |
| 2020/0174078 A1 | 6/2020 | Salo, III et al. |
| 2020/0274370 A1 | 8/2020 | Krieg |
| 2021/0048374 A1 | 2/2021 | Sampson et al. |
| 2021/0049480 A1 | 2/2021 | Kale et al. |
| 2021/0135462 A1 | 5/2021 | Sampson et al. |
| 2021/0141021 A1 | 5/2021 | Salo, III et al. |
| 2021/0141043 A1 | 5/2021 | Bertness |
| 2021/0203016 A1 | 7/2021 | Bertness |
| 2021/0231737 A1 | 7/2021 | Salo, III et al. |
| 2021/0325471 A1 | 10/2021 | Bertness |
| 2022/0050142 A1 | 2/2022 | Bertness |

FOREIGN PATENT DOCUMENTS

| | | | |
|---|---|---|---|
| CN | 103091633 | 5/2013 | |
| CN | 206658084 | 11/2017 | |
| DE | 29 26 716 B1 | 1/1981 | |
| DE | 40 07 883 | 9/1991 | |
| DE | 196 38 324 | 9/1996 | |
| DE | 601 12 502 T2 | 6/2006 | |
| DE | 10 2009 013 857 | 10/2009 | |
| DE | 10 2008 036 595 A1 | 2/2010 | |
| DE | 102018001885 A1 * | 9/2018 | |
| EP | 0 022 450 A1 | 1/1981 | |
| EP | 0 391 694 A2 | 4/1990 | |
| EP | 0 476 405 A1 | 9/1991 | |
| EP | 0 637 754 A1 | 2/1995 | |
| EP | 0 772 056 A1 | 5/1997 | |
| EP | 0 982 159 A2 | 3/2000 | |
| EP | 1 810 869 A1 | 11/2004 | |
| EP | 1 786 057 | 5/2007 | |
| EP | 1 807 710 B1 | 7/2007 | |
| EP | 10 807 710 | 1/2010 | |
| EP | 2 302 724 | 3/2011 | |
| FR | 2 749 397 | 12/1997 | |
| GB | 154 016 | 11/1920 | |
| GB | 2 029 586 | 3/1980 | |
| GB | 2 088 159 A | 6/1982 | |
| GB | 2 246 916 A | 10/1990 | |
| GB | 2266150 A * | 10/1993 | ............. G01B 21/18 |
| GB | 2 275 783 A | 7/1994 | |
| GB | 2 353 367 | 2/2001 | |
| GB | 2 387 235 A | 10/2003 | |
| JP | 59-17892 | 1/1984 | |
| JP | 59-17893 | 1/1984 | |
| JP | 59017894 | 1/1984 | |
| JP | 59215674 | 12/1984 | |
| JP | 60225078 | 11/1985 | |
| JP | 62-180284 | 8/1987 | |
| JP | 63027776 | 2/1988 | |
| JP | 03274479 | 12/1991 | |
| JP | 03282276 | 12/1991 | |
| JP | 4-8636 | 1/1992 | |
| JP | 04095788 | 3/1992 | |
| JP | 04131779 | 5/1992 | |
| JP | 04372536 | 12/1992 | |
| JP | 05211724 A | 8/1993 | |
| JP | 5216550 | 8/1993 | |
| JP | 7-128414 | 5/1995 | |
| JP | 09061505 | 3/1997 | |
| JP | 10056744 | 2/1998 | |
| JP | 10232273 | 9/1998 | |
| JP | 11103503 A | 4/1999 | |
| JP | 11-150809 | 6/1999 | |
| JP | 11-271409 | 10/1999 | |
| JP | 2001-023037 | 1/2001 | |
| JP | 2001057711 A | 2/2001 | |
| JP | 2003-346909 | 12/2003 | |
| JP | 2005-238969 | 9/2005 | |

(56) References Cited

FOREIGN PATENT DOCUMENTS

| | | | |
|---|---|---|---|
| JP | 2006242674 A * | 9/2006 | |
| JP | 2006331976 A | 12/2006 | |
| JP | 2009-244166 | 10/2009 | |
| JP | 2009-261174 | 11/2009 | |
| JP | 2010-172122 | 5/2010 | |
| JP | 2010-172142 | 8/2010 | |
| RU | 2089015 C1 | 8/1997 | |
| WO | WO 93/22666 | 11/1993 | |
| WO | WO 94/05069 | 3/1994 | |
| WO | WO 96/01456 | 1/1996 | |
| WO | WO 96/06747 | 3/1996 | |
| WO | WO 96/28846 | 9/1996 | |
| WO | WO 97/01103 | 1/1997 | |
| WO | WO 97/44652 | 11/1997 | |
| WO | WO 98/04910 | 2/1998 | |
| WO | WO 98/21132 | 5/1998 | |
| WO | WO 98/58270 | 12/1998 | |
| WO | WO 99/23738 | 5/1999 | |
| WO | WO 99/56121 | 11/1999 | |
| WO | WO 00/16083 | 3/2000 | |
| WO | WO 00/62049 | 10/2000 | |
| WO | WO 00/67359 | 11/2000 | |
| WO | WO 01/59443 | 2/2001 | |
| WO | WO 01/16614 | 3/2001 | |
| WO | WO 01/16615 | 3/2001 | |
| WO | WO 01/51947 | 7/2001 | |
| WO | WO 03/047064 A3 | 6/2003 | |
| WO | WO 03/076960 A1 | 9/2003 | |
| WO | WO 2004/047215 A1 | 6/2004 | |
| WO | WO-2007059935 A1 * | 5/2007 | ............. B60C 11/24 |
| WO | WO 2007/075403 | 7/2007 | |
| WO | WO 2009/004001 | 1/2009 | |
| WO | WO 2010/007681 | 1/2010 | |
| WO | WO 2010/035605 | 4/2010 | |
| WO | WO 2010/042517 | 4/2010 | |
| WO | WO 2011/153419 | 12/2011 | |
| WO | WO 2012/078921 | 6/2012 | |
| WO | WO 2013/070850 | 5/2013 | |

OTHER PUBLICATIONS

"Battery Impedance", by E. Willihnganz et al., *Electrical Engineering*, Sep. 1959, pp. 922-925.
"Determining the End of Battery Life", by S. DeBardelaben, *IEEE*, 1986, pp. 365-368.
"A Look at the Impedance of a Cell", by S. Debardelaben, *IEEE*, 1988, pp. 394-397.
"The Impedance of Electrical Storage Cells", by N.A. Hampson et al., *Journal of Applied Electrochemistry*, 1980, pp. 3-11.
"A Package for Impedance/Admittance Data Analysis", by B. Boukamp, *Solid State Ionics*, 1986, pp. 136-140.
"Precision of Impedance Spectroscopy Estimates of Bulk, Reaction Rate, and Diffusion Parameters", by J. Macdonald et al., *J. Electroanal, Chem.*, 1991, pp. 1-11.
Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128, 131.
IEEE Recommended Practice for Maintenance, Testings, and Replacement of Large Lead Storage Batteries for Generating Stations and Substations, *The Institute of Electrical and Electronics Engineers, Inc.*, ANSI/IEEE Std. 450-1987, Mar. 9, 1987, pp. 7-15.
"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.
"JIS Japanese Industrial Standard-Lead Acid Batteries for Automobiles", *Japanese Standards Association UDC*, 621.355.2: 629.113. 006, Nov. 1995.
"Performance of Dry Cells", by C. Hambuechen, Preprint of *Am. Electrochem. Soc.*, Apr. 18-20, 1912, paper No. 19, pp. 1-5.
"A Bridge for Measuring Storage Battery Resistance", by E. Wilihncanz, *The Electrochemical Society*, preprint 79-20, Apr. 1941, pp. 253-258.

National Semiconductor Corporation, "High Q Notch Filter", Mar. 1969, Linear Brief 5, Mar. 1969.
Burr-Brown Corporation, "Design a 60 Hz Notch Filter with the UAF42", Jan. 1994, AB-071, 1994.
National Semiconductor Corporation, "LMF90-4$^{th}$-Order Elliptic Notch Filter", Dec. 1994, RRD-B30M115, Dec. 1994.
"Alligator Clips with Wire Penetrators" *J.S. Popper, Inc.* product information, downloaded from http://www.jspopper.com/, prior to Oct. 1, 2002.
"#12: LM78840 Simple Switcher DC to DC Converter", *ITM e-Catalog*, downloaded from http://www.pcbcafe.com, prior to Oct. 1, 2002.
"Simple DC-DC Converts Allows Use of Single Battery", *Electronix Express*, downloaded from http://www.elexp.com/t_dc--dc.htm, prior to Oct. 1, 2002.
"DC-DC Converter Basics", *Power Designers*, downloaded from http://www.powerdesigners.com/InforWeb.design_center/articles/DC—DC/converter.shtm, prior to Oct. 1, 2002.
"Notification of Transmittal of the International Search Report or the Declaration", PCT/US02/29461, filed Sep. 17, 2002 and dated Jan. 3, 2003.
"Notification of Transmittal of the International Search Report or the Declaration", PCT/US03/07546, filed Mar. 13, 2003 and dated Jul. 4, 2001.
"Notification of Transmittal of the International Search Report or the Declaration", PCT/US03/06577, filed Mar. 5, 2003 and dated Jul. 24, 2003.
"Notification of Transmittal of the International Search Report or the Declaration", PCT/US03/07837, filed Mar. 14, 2003 and dated Jul. 4, 2003.
"Improved Impedance Spectroscopy Technique for Status Determination of Production Li/SO$_2$ Batteries" Terrill Atwater et al., pp. 10-113, (1992).
"Notification of Transmittal of the International Search Report or the Declaration", PCT/US03/41561; Search Report completed Apr. 13, 2004, dated May 6, 2004.
"Notification of Transmittal of the International Search Report or the Declaration", PCT/US03/27696, filed Sep. 4, 2003 and dated Apr. 15, 2004.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois, pp. 1-1-14-13, (1991).
Supplementary European Search Report Communication for Appl. No. 99917402.2; dated Sep. 7, 2004.
"Dynamic modelling of lead/acid batteries using impedance spectroscopy for parameter identification", Journal of Power Sources, pp. 69-84, (1997).
Notification of Transmittal of the International Search Report for PCT/US03/30707, filed Sep. 30, 2003 and dated Nov. 24, 2004.
"A review of impedance measurements for determination of the state-of-charge or state-of-health of secondary batteries", Journal of Power Sources, pp. 59-69, (1998).
"Search Report Under Section 17" for Great Britain Application No. GB0421447.4, date of search Jan. 27, 2005, dated Jan. 28, 2005.
"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*, published Oct. 2001, IEE, pp. 433-440.
"Examination Report" from the UK Patent Office for App. No. 0417678.0; dated Jan. 24, 2005.
Wikipedia Online Encyclopedia, Inductance, 2005, http://en.wikipedia.org/wiki/inductance, pp. 1-5, mutual Inductance, pp. 3, 4.
"Professional BCS System Analyzer Battery-Charger-Starting", pp. 2-8, (2001).
Young Illustrated Encyclopedia Dictionary of Electronics, 1981, Parker Publishing Company, Inc., pp. 318-319.
"DSP Applications in Hybrid Electric Vehicle Powertrain", Miller et al., Proceedings of the American Control Conference, San Diego, CA, Jun. 1999; 2 ppg.

(56) References Cited

OTHER PUBLICATIONS

"Notification of Transmittal of the International Search Report and the Written Opinion of the International Searching Authority, or the Declaration" for PCT/US2008/008702 filed Jul. 2008; 15 pages.
"A Microprocessor-Based Control System for a Near-Term Electric Vehicle", Bimal K. Bose; IEEE Transactions on Industry Applications, vol. IA-17, No. 6, Nov./Dec. 1981; 0093-9994/81/1100-0626$00.75 © 1981 IEEE, 6 pages.
Notification of Transmittal of the International Search Report and the Written Opinion of the International Searching Authority, or the Declaration for PCT/US2011/038279 filed May 27, 2011, dated Sep. 16, 2011, 12 pages.
U.S. Appl. No. 60/387,912, filed Jun. 13, 2002 which is related to U.S. Pat. No. 7,089,127.
"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs.).
"Field and Laboratory Studies to Assess the State of Health of Valve-Regulated Lead Acid Batteries: Part I-Conductance/Capacity Correlation Studies", by D. Feder at al., Oct. 1992, pp. 1-15; (19 total pgs.).
"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.).
"Conductance Testing of Standby Batteries in Signaling and Communications Applications for the Purpose of Evaluating Battery State-of-Health", by S. McShane, Apr. 1993, pp. 1-9; (14 total pgs.).
"Condutance Monitoring of Recombination Lead Acid Batteries", by B. Jones, May 1993, pp. 1-6; (11 total pgs.).
"Evaluating the State-of-Health of Lead Acid Flooded and Valve-Regulated Batteries: a Comparison of Conductance Testing vs. Traditional Methods", by M. Hlavac et al., Jun. 1993, pp. 1-15; (20 total pgs.).
"Updated State of Conductance/Capacity Correlation Studies to Determine the State-of- Health of Automotive SLI and Standby Lead Acid Batteries", by D. Feder et al., Sep. 1993, pp. 1-17; (22 total pgs.).
"Field and Laboratory Studies to Access the State-of-Health of Valve-Regulated Lead-Acid Battery Technologies Using Conductance Testing Part II-Further Conductance/Capacity Correlation Studies", by M. Hlavac et al., Sep. 1993, pgs. 1-9; (14 total pgs.).
"Field Experience of Testing VRLA Batteries by Measuring Conductance", by M.W. Kniveton, May 1994, pp. 1-4; (9 total pgs.).
"Reducing the Cost of Maintaining Vrla Batteries in Telecom Applications", by M.W. Kniveton, Sep. 1994, pp. 1-5; (10 total pgs.).
"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).
"Testing 24 Volt Aircraft Batteries Using Midtronics Conductance Technology", by M. Hlavac et al., Jan. 1995, 9 pgs; (13 total pgs.).
"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).
"VRLA Battery Conductance Monitoring Part V: Strategies for VRLA Battery Testing and Monitoring in Telecom Operating Environments", by M. Hlavac et al., Oct. 1996, 9 pgs; (13 total pgs.).
"Midpoint Conductance Technology Used in Telecommunication Stationary Standby Battery Applications Part VI: Considerations for Deployment of Midpoint Conductance in Telecommunications Power Applications", by M. Troy et al., Oct. 1997, 9 pgs; (13 total pgs.).
"Impedance/Conductance Measurements as an Aid to Determining Replacement Strategies", M. Kniveton, Sep. 1998, pp. 297-301; (9 total pgs.).
"A Fundamentally New Approach to Battery Performance Analysis Using DFRA™/DTIS™ Technology", by K. Champlin et al., Sep. 2000, 8 pgs; (12 total pgs.).
"Battery State of Health Monitoring, Combining Conductance Technology With Other Measurement Parameters for Real-Time Battery Performance Analysis", by D. Cox et al., Mar. 2000, 6 pgs; (10 total pgs.).
Search Report and Written Opinion from PCT Application No. PCT/US2011/026608, dated Aug. 29, 2011, 9 pgs.
Examination Report under section 18(3) for corresponding Great Britain Application No. GB1000773.0, dated Feb. 6, 2012, 2 pages.
Communication from GB1216105.5, dated Sep. 21, 2012.
Notification of Transmittal of the International Search Report and Written Opinion from PCT/US2011/039043, dated Jul. 26, 2012.
Notification of Transmittal of the International Search Report and Written Opinion from PCT/US2011/053886, dated Jul. 27, 2012.
"Field Evaluation of Honda's EV PLUS Battery Packs", by A. Paryani, *IEEE AES Systems Magazine*, Nov. 2000, pp. 21-24.
Search Report from PCT/US2011/047354, dated Nov. 11, 2011.
Written Opinion from PCT/US2011/047354, dated Nov. 11, 2011.
First Office Action (Notification of Reasons for Rejections) dated Dec. 3, 2013 in related Japanese patent application No. 2013-513370, 9 pgs. Including English Translation.
Official Action dated Jan. 22, 2014 in Korean patent application No. 10-2012-7033020, 2 pgs including English Translation.
Official Action dated Feb. 20, 2014 in Korean patent application No. 10-2013-7004814, 6 pgs including English Translation.
First Office Action for Chinese Patent Application No. 201180011597.4, dated May 6, 2014, 20 pages.
Office Action from Korean Application No. 10-2012-7033020, dated Jul. 29, 2014.
Office Action for Chinese Patent Application No. 201180038844.X, dated Jul. 1, 2014.
Office Action 2014. for Chinese Patent Application No. 201180030045.8, dated Jul. 21, 2014.
Office Action for German Patent Application No. 1120111020643 dated Aug. 28, 2014.
Office Action from Japanese Patent Application No. 2013-513370, dated Aug. 5, 2014.
Office Action from Japanese Patent Application No. 2013-531839, dated Jul. 8, 2014.
Office Action for German Patent Application No. 103 32 625.1, dated Nov. 7, 2014, 14 pages.
Office Action from Chinese Patent Application No. 201180038844.X, dated Dec. 8, 2014.
Office Action from CN Application No. 201180011597.4, dated Jan. 6, 2015.
Office Action for Chinese Patent Application No. 201180030045.8, dated Mar. 24, 2015.
Office Action for Japanese Patent Application No. 2013-531839, dated Mar. 31, 2015.
Notification of from PCT/US2014/069661, Transmittal of the International Search Report and Written Opinion dated Mar. 26, 2015.
Office Action for Chinese Patent Application No. 201180038844.X, dated Jun. 8, 2015.
Office Action from Chinese Patent Application No. 201180011597.4 dated Jun. 3, 2015.
European Search Report from European Application No. EP 15151426.2, dated Jun. 1, 2015.
Notification of Transmittal of the International Search Report and the Written Opinion from PCT/US2016/014867, dated Jun. 3, 2016.
Office Action from Japanese Patent Application No. 2015-014002, dated Jul. 19, 2016.
Notification of Transmittal of the International Search Report and the Written Opinion of the International Searching Authority from PCT/US2016/029696, dated Aug. 24, 2016.
Office Action from German Patent Application No. 10393251.8, dated Nov. 4, 2016, including English translation.
Office Action from European Patent Application No. 15 151 426.2-1801, dated Aug. 28, 2017, 2 pages.
Office Action from German Patent Application No. 112011101892.4, dated Sep. 7, 2017.

(56) References Cited

OTHER PUBLICATIONS

Office Action from Japanese Patent Application No. 2017-026740, dated Jan. 9, 2018.
Office Action from Chinese Patent Application No. 201480066251.8, dated May 29, 2018.
Brochure: "Sensors Intelligent Battery Sensors, Measuring Battery Capacity and Ageing", by Hella, 6 pgs.
Office Action from Japanese Patent Application No. 2017-026740, dated May 8, 2018.
U.S. Appl. No. 12/697,485, filed Feb. 1, 2010, 36 pgs.
Office Action from Chinese Patent Application No. 201480066251.8, dated Dec. 13, 2018.
Notification of Transmittal of the International Search Report and the Written Opinion of the International Searching Authority, or the Declaration for PCT/US2019/014487, dated Apr. 11, 2019.
Notification of Transmittal of the International Search Report and the Written Opinion of the International Searching Authority, or the Declaration for PCT/US2019/014494, dated Apr. 24, 2019.
U.S. Appl. No. 16/943,120, filed Jul. 30, 2020 (should publish Jan. 30, 2021).
Office Action from German Patent Application No. 11 2011 101 892.4, dated Oct. 1, 2020, and translation using Google Translate.
Wikipedia Online Encyclopedia, https: // de.wikipedia.org/w/index.php?title= four-wire measurement & oldid=67143514-4 (Retrieved Sep. 15, 2020) along with Google Translation.
Notification of Transmittal of the International Search Report and the Written Opinion of the International Searching Authority, or the Declaration for PCT/US2020/059015, dated Jan. 22, 2021.
U.S. Appl. No. 17/504,897, filed Oct. 19, 2021.
Notification of Transmittal of the International Search Report and the Written Opinion of the International Searching Authority, or the Declaration for PCT/US2021/040313 dated Oct. 25, 2021; 14 pages.
U.S. Appl. No. 17/739,393, filed May 9, 2022.
U.S. Appl. No. 17/750,719, filed May 23, 2022.

\* cited by examiner

TIRE TREAD GAUGE USING VISUAL INDICATOR

CROSS-REFERENCE TO RELATED APPLICATION

The present application is based on and claims the benefit of U.S. provisional patent application Ser. No. 62/880,782, filed Jul. 31, 2019, the content of which is hereby incorporated by reference in its entirety.

BACKGROUND

The present invention relates to automotive vehicles. More specifically, the present invention relates to maintenance devices for use with automotive vehicles.

Storage batteries are an important component of modern automotive vehicles. Vehicles with internal combustion engines use such batteries to start the engine or run electrical equipment when the engine is not operating. Electric vehicles use such batteries as a source of power. It is frequently desirable to test storage batteries so that a failing battery can be identified and replaced prior to its ultimate failure, so that a battery with a low state of charge can be recharged, etc. Battery testers are typically limited to a few types of tests.

Many battery-testing and vehicle maintenance techniques have been developed through the years. Midtronics, Inc. of Willowbrook, Ill. and Dr. Keith S. Champlin have been pioneers in such techniques and related technologies. Examples of their work are shown in U.S. Pat. No. 3,873,911, issued Mar. 25, 1975, to Champlin; U.S. Pat. No. 3,909,708, issued Sep. 30, 1975, to Champlin; U.S. Pat. No. 4,816,768, issued Mar. 28, 1989, to Champlin; U.S. Pat. No. 4,825,170, issued Apr. 25, 1989, to Champlin; U.S. Pat. No. 4,881,038, issued Nov. 14, 1989, to Champlin; U.S. Pat. No. 4,912,416, issued Mar. 27, 1990, to Champlin; U.S. Pat. No. 5,140,269, issued Aug. 18, 1992, to Champlin; U.S. Pat. No. 5,343,380, issued Aug. 30, 1994; U.S. Pat. No. 5,572,136, issued Nov. 5, 1996; U.S. Pat. No. 5,574,355, issued Nov. 12, 1996; U.S. Pat. No. 5,583,416, issued Dec. 10, 1996; U.S. Pat. No. 5,585,728, issued Dec. 17, 1996; U.S. Pat. No. 5,589,757, issued Dec. 31, 1996; U.S. Pat. No. 5,592,093, issued Jan. 7, 1997; U.S. Pat. No. 5,598,098, issued Jan. 28, 1997; U.S. Pat. No. 5,656,920, issued Aug. 12, 1997; U.S. Pat. No. 5,757,192, issued May 26, 1998; U.S. Pat. No. 5,821,756, issued Oct. 13, 1998; U.S. Pat. No. 5,831,435, issued Nov. 3, 1998; U.S. Pat. No. 5,871,858, issued Feb. 16, 1999; U.S. Pat. No. 5,914,605, issued Jun. 22, 1999; U.S. Pat. No. 5,945,829, issued Aug. 31, 1999; U.S. Pat. No. 6,002,238, issued Dec. 14, 1999; U.S. Pat. No. 6,037,751, issued Mar. 14, 2000; U.S. Pat. No. 6,037,777, issued Mar. 14, 2000; U.S. Pat. No. 6,051,976, issued Apr. 18, 2000; U.S. Pat. No. 6,081,098, issued Jun. 27, 2000; U.S. Pat. No. 6,091,245, issued Jul. 18, 2000; U.S. Pat. No. 6,104,167, issued Aug. 15, 2000; U.S. Pat. No. 6,137,269, issued Oct. 24, 2000; U.S. Pat. No. 6,163,156, issued Dec. 19, 2000; U.S. Pat. No. 6,172,483, issued Jan. 9, 2001; U.S. Pat. No. 6,172,505, issued Jan. 9, 2001; U.S. Pat. No. 6,222,369, issued Apr. 24, 2001; U.S. Pat. No. 6,225,808, issued May 1, 2001; U.S. Pat. No. 6,249,124, issued Jun. 19, 2001; U.S. Pat. No. 6,259,254, issued Jul. 10, 2001; U.S. Pat. No. 6,262,563, issued Jul. 17, 2001; U.S. Pat. No. 6,294,896, issued Sep. 25, 2001; U.S. Pat. No. 6,294,897, issued Sep. 25, 2001; U.S. Pat. No. 6,304,087, issued Oct. 16, 2001; U.S. Pat. No. 6,310,481, issued Oct. 30, 2001; U.S. Pat. No. 6,313,607, issued Nov. 6, 2001; U.S. Pat. No. 6,313,608, issued Nov. 6, 2001; U.S. Pat. No. 6,316,914, issued Nov. 13, 2001; U.S. Pat. No. 6,323,650, issued Nov. 27, 2001; U.S. Pat. No. 6,329,793, issued Dec. 11, 2001; U.S. Pat. No. 6,331,762, issued Dec. 18, 2001; U.S. Pat. No. 6,332,113, issued Dec. 18, 2001; U.S. Pat. No. 6,351,102, issued Feb. 26, 2002; U.S. Pat. No. 6,359,441, issued Mar. 19, 2002; U.S. Pat. No. 6,363,303, issued Mar. 26, 2002; U.S. Pat. No. 6,377,031, issued Apr. 23, 2002; U.S. Pat. No. 6,392,414, issued May 21, 2002; U.S. Pat. No. 6,417,669, issued Jul. 9, 2002; U.S. Pat. No. 6,424,158, issued Jul. 23, 2002; U.S. Pat. No. 6,441,585, issued Aug. 17, 2002; U.S. Pat. No. 6,437,957, issued Aug. 20, 2002; U.S. Pat. No. 6,445,158, issued Sep. 3, 2002; U.S. Pat. Nos. 6,456,045; 6,466,025, issued Oct. 15, 2002; U.S. Pat. No. 6,465,908, issued Oct. 15, 2002; U.S. Pat. No. 6,466,026, issued Oct. 15, 2002; U.S. Pat. No. 6,469,511, issued Nov. 22, 2002; U.S. Pat. No. 6,495,990, issued Dec. 17, 2002; U.S. Pat. No. 6,497,209, issued Dec. 24, 2002; U.S. Pat. No. 6,507,196, issued Jan. 14, 2003; U.S. Pat. No. 6,534,993; issued Mar. 18, 2003; U.S. Pat. No. 6,544,078, issued Apr. 8, 2003; U.S. Pat. No. 6,556,019, issued Apr. 29, 2003; U.S. Pat. No. 6,566,883, issued May 20, 2003; U.S. Pat. No. 6,586,941, issued Jul. 1, 2003; U.S. Pat. No. 6,597,150, issued Jul. 22, 2003; U.S. Pat. No. 6,621,272, issued Sep. 16, 2003; U.S. Pat. No. 6,623,314, issued Sep. 23, 2003; U.S. Pat. No. 6,633,165, issued Oct. 14, 2003; U.S. Pat. No. 6,635,974, issued Oct. 21, 2003; U.S. Pat. No. 6,696,819, issued Feb. 24, 20144; U.S. Pat. No. 6,707,303, issued Mar. 16, 2004; U.S. Pat. No. 6,737,831, issued May 18, 2004; U.S. Pat. No. 6,744,149, issued Jun. 1, 2004; U.S. Pat. No. 6,759,849, issued Jul. 6, 2004; U.S. Pat. No. 6,781,382, issued Aug. 24, 2004; U.S. Pat. No. 6,788,025, filed Sep. 7, 2004; U.S. Pat. No. 6,795,782, issued Sep. 21, 2004; U.S. Pat. No. 6,805,090, filed Oct. 19, 2004; U.S. Pat. No. 6,806,716, filed Oct. 19, 2004; U.S. Pat. No. 6,850,037, filed Feb. 1, 2005; U.S. Pat. No. 6,850,037, issued Feb. 1, 2005; U.S. Pat. No. 6,871,151, issued march 22, 2005; U.S. Pat. No. 6,885,195, issued Apr. 26, 2005; U.S. Pat. No. 6,888,468, issued May 3, 2005; U.S. Pat. No. 6,891,378, issued May 10, 2005; U.S. Pat. No. 6,906,522, issued Jun. 14, 2005; U.S. Pat. No. 6,906,523, issued Jun. 14, 2005; U.S. Pat. No. 6,909,287, issued Jun. 21, 2005; U.S. Pat. No. 6,914,413, issued Jul. 5, 2005; U.S. Pat. No. 6,913,483, issued Jul. 5, 2005; U.S. Pat. No. 6,930,485, issued Aug. 16, 2005; U.S. Pat. No. 6,933,727, issued Aug. 23, 200; U.S. Pat. No. 6,941,234, filed Sep. 6, 2005; U.S. Pat. No. 6,967,484, issued Nov. 22, 2005; U.S. Pat. No. 6,998,847, issued Feb. 14, 2006; U.S. Pat. No. 7,003,410, issued Feb. 21, 2006; U.S. Pat. No. 7,003,411, issued Feb. 21, 2006; U.S. Pat. No. 7,012,433, issued Mar. 14, 2006; U.S. Pat. No. 7,015,674, issued Mar. 21, 2006; U.S. Pat. No. 7,034,541, issued Apr. 25, 2006; U.S. Pat. No. 7,039,533, issued May 2, 2006; U.S. Pat. No. 7,058,525, issued Jun. 6, 2006; U.S. Pat. No. 7,081,755, issued Jul. 25, 2006; U.S. Pat. No. 7,106,070, issued Sep. 12, 2006; U.S. Pat. No. 7,116,109, issued Oct. 3, 2006; U.S. Pat. No. 7,119,686, issued Oct. 10, 2006; and U.S. Pat. No. 7,126,341, issued Oct. 24, 2006; U.S. Pat. No. 7,154,276, issued Dec. 26, 2006; U.S. Pat. No. 7,198,510, issued Apr. 3, 2007; U.S. Pat. No. 7,363,175, issued Apr. 22, 2008; U.S. Pat. No. 7,208,914, issued Apr. 24, 2007; U.S. Pat. No. 7,246,015, issued Jul. 17, 2007; U.S. Pat. No. 7,295,936, issued Nov. 13, 2007; U.S. Pat. No. 7,319,304, issued Jan. 15, 2008; U.S. Pat. No. 7,363,175, issued Apr. 22, 2008; U.S. Pat. No. 7,398,176, issued Jul. 8, 2008; U.S. Pat. No. 7,408,358, issued Aug. 5, 2008; U.S. Pat. No. 7,425,833, issued Sep. 16, 2008; U.S. Pat. No. 7,446,536, issued Nov. 4, 2008; U.S. Pat. No. 7,479,763, issued Jan. 20, 2009; U.S. Pat. No.

7,498,767, issued Mar. 3, 2009; U.S. Pat. No. 7,501,795, issued Mar. 10, 2009; U.S. Pat. No. 7,505,856, issued Mar. 17, 2009; U.S. Pat. No. 7,545,146, issued Jun. 9, 2009; U.S. Pat. No. 7,557,586, issued Jul. 7, 2009; U.S. Pat. No. 7,595,643, issued Sep. 29, 2009; U.S. Pat. No. 7,598,699, issued Oct. 6, 2009; U.S. Pat. No. 7,598,744, issued Oct. 6, 2009; U.S. Pat. No. 7,598,743, issued Oct. 6, 2009; U.S. Pat. No. 7,619,417, issued Nov. 17, 2009; U.S. Pat. No. 7,642,786, issued Jan. 5, 2010; U.S. Pat. No. 7,642,787, issued Jan. 5, 2010; U.S. Pat. No. 7,656,162, issued Feb. 2, 2010; U.S. Pat. No. 7,688,074, issued Mar. 30, 2010; U.S. Pat. No. 7,705,602, issued Apr. 27, 2010; U.S. Pat. No. 7,706,992, issued Apr. 27, 2010; U.S. Pat. No. 7,710,119, issued May 4, 2010; U.S. Pat. No. 7,723,993, issued May 25, 2010; U.S. Pat. No. 7,728,597, issued Jun. 1, 2010; U.S. Pat. No. 7,772,850, issued Aug. 10, 2010; U.S. Pat. No. 7,774,151, issued Aug. 10, 2010; U.S. Pat. No. 7,777,612, issued Aug. 17, 2010; U.S. Pat. No. 7,791,348, issued Sep. 7, 2010; U.S. Pat. No. 7,808,375, issued Oct. 5, 2010; U.S. Pat. No. 7,924,015, issued Apr. 12, 2011; U.S. Pat. No. 7,940,053, issued May 10, 2011; U.S. Pat. No. 7,940,052, issued May 10, 2011; U.S. Pat. No. 7,959,476, issued Jun. 14, 2011; U.S. Pat. No. 7,977,914, issued Jul. 12, 2011; U.S. Pat. No. 7,999,505, issued Aug. 16, 2011; U.S. Pat. No. D643,759, issued Aug. 23, 2011; U.S. Pat. No. 8,164,343, issued Apr. 24, 2012; U.S. Pat. No. 8,198,900, issued Jun. 12, 2012; U.S. Pat. No. 8,203,345, issued Jun. 19, 2012; U.S. Pat. No. 8,237,448, issued Aug. 7, 2012; U.S. Pat. No. 8,306,690, issued Nov. 6, 2012; U.S. Pat. No. 8,344,685, issued Jan. 1, 2013; U.S. Pat. No. 8,436,619, issued May 7, 2013; U.S. Pat. No. 8,442,877, issued May 14, 2013; U.S. Pat. No. 8,493,022, issued Jul. 23, 2013; U.S. Pat. No. D687,727, issued Aug. 13, 2013; U.S. Pat. No. 8,513,949, issued Aug. 20, 2013; U.S. Pat. No. 8,674,654, issued Mar. 18, 2014; U.S. Pat. No. 8,674,711, issued Mar. 18, 2014; U.S. Pat. No. 8,704,483, issued Apr. 22, 2014; U.S. Pat. No. 8,738,309, issued May 27, 2014; U.S. Pat. No. 8,754,653, issued Jun. 17, 2014; U.S. Pat. No. 8,872,516, issued Oct. 28, 2014; U.S. Pat. No. 8,872,517, issued Oct. 28, 2014; U.S. Pat. No. 8,958,998, issued Feb. 17, 2015; U.S. Pat. No. 8,963,550, issued Feb. 24, 2015; U.S. Pat. No. 9,018,958, issued Apr. 28, 2015; U.S. Pat. No. 9,052,366, issued Jun. 9, 2015; U.S. Pat. No. 9,201,120, issued Dec. 1, 2015; U.S. Pat. No. 9,229,062, issued Jan. 5, 20126; U.S. Pat. No. 9,244,100, issued Jan. 26, 2016; U.S. Pat. No. 9,274,157, issued Mar. 1, 2016; U.S. Pat. No. 9,312,575, issued Apr. 12, 2016; U.S. Pat. No. 9,335,362, issued May 10, 2016; U.S. Pat. No. 9,425,487, issued Aug. 23, 2016; U.S. Pat. No. 9,419,311, issued Aug. 16, 2016; U.S. Pat. No. 9,496,720, issued Nov. 15, 2016; U.S. Pat. No. 9,588,185, issued Mar. 7, 2017; U.S. Pat. No. 9,923,289, issued Mar. 20, 2018; U.S. Pat. No. 9,966,676, issued May 8, 2018; U.S. Pat. No. 10,046,649, issued Aug. 14, 2018; U.S. Pat. No. 10,222,397, issued Mar. 5, 2019; U.S. Pat. No. 10,317,468, issued Jun. 11, 2019; U.S. Pat. No. 10,429,449, issued Oct. 1, 2019; U.S. Pat. No. 10,473,555, issued Nov. 12, 2019; U.S. Pat. No. 10,608,353, issued Mar. 31, 2020; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/263,473, filed Oct. 2, 2002, entitled ELECTRONIC BATTERY TESTER WITH RELATIVE TEST OUTPUT; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/681,666, filed Oct. 8, 2003, entitled ELECTRONIC BATTERY TESTER WITH PROBE LIGHT; U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 11/356,443, filed Feb. 16, 2006, entitled ELECTRONIC BATTERY TESTER WITH NETWORK COMMUNICATION; U.S. Ser. No. 12/697,485, filed Feb. 1, 2010, entitled ELECTRONIC BATTERY TESTER; U.S. Ser. No. 12/769,911, filed Apr. 29, 2010, entitled STATIONARY BATTERY TESTER; U.S. Ser. No. 13/098,661, filed May 2, 2011, entitled METHOD AND APPARATUS FOR MEASURING A PARAMETER OF A VEHICLE ELECTRICAL SYSTEM; U.S. Ser. No. 13/152,711, filed Jun. 3, 2011, entitled BATTERY PACK MAINTENANCE FOR ELECTRIC VEHICLE; U.S. Ser. No. 14/039,746, filed Sep. 27, 2013, entitled BATTERY PACK MAINTENANCE FOR ELECTRIC VEHICLE; U.S. Ser. No. 14/565,689, filed Dec. 10, 2014, entitled BATTERY TESTER AND BATTERY REGISTRATION TOOL; U.S. Ser. No. 15/017,887, filed Feb. 8, 2016, entitled METHOD AND APPARATUS FOR MEASURING A PARAMETER OF A VEHICLE ELECTRICAL SYSTEM; U.S. Ser. No. 15/049,483, filed Feb. 22, 2016, entitled BATTERY TESTER FOR ELECTRIC VEHICLE; U.S. Ser. No. 15/077,975, filed Mar. 23, 2016, entitled BATTERY MAINTENANCE SYSTEM; U.S. Ser. No. 15/140,820, filed Apr. 28, 2016, entitled CALIBRATION AND PROGRAMMING OF IN-VEHICLE BATTERY SENSOR; U.S. Ser. No. 15/149,579, filed May 9, 2016, entitled BATTERY TESTER FOR ELECTRIC VEHICLE; U.S. Ser. No. 15/791,772, field Oct. 24, 2017, entitled ELECTRICAL LOAD FOR ELECTRONIC BATTERY TESTER AND ELECTRONIC BATTERY TESTER INCLUDING SUCH ELECTRICAL LOAD; U.S. Ser. No. 16/021,538, filed Jun. 28, 2018, entitled BATTERY PACK MAINTENANCE FOR ELECTRIC VEHICLE; U.S. Ser. No. 16/056,991, filed Aug. 7, 2018, entitled HYBRID AND ELECTRIC VEHICLE BATTERY PACK MAINTENANCE DEVICE, U.S. Ser. No. 16/253,526, filed Jan. 22, 2019, entitled HIGH CAPACITY BATTERY BALANCER; U.S. Ser. No. 16/253,549, filed Jan. 22, 2019, entitled HYBRID AND ELECTRIC VEHICLE BATTERY PACK MAINTENANCE DEVICE; U.S. Ser. No. 16/297,975, filed Mar. 11, 2019, entitled HIGH USE BATTERY PACK MAINTENANCE; U.S. Ser. No. 16/695,705, filed Nov. 26, 2019, entitled BATTERY RATING VERSUS OEM SPECIFICATION; all of which are incorporated herein by reference in their entireties.

In addition to improvements in battery testing techniques, it is also desirable to provide additional testing and diagnostic devices for the maintenance of automotive vehicles. One such device is a device which measures the tread depth of tires on an automotive vehicle. Such information can be used to determine whether the tire tread is within specification or if the tire should be replaced prior to its ultimate failure. The depth of the tire tread can be measured using a ruler or other such device. However, the test result when using a ruler is not necessarily memorialized and it is possible to falsify the test result, or misinterpret the test result.

SUMMARY

A tire tread gauge is arranged to be inserted into a tread of a tire. The tire tread gauge including a visual indicator. An image capture device is configured to capture an image of the tire tread gauge when the tire tread gauge is inserted into the tread of the tire. The tire tread gauge can be incorporated into an electronic battery tester for testing a storage battery includes a Kelvin connection configured to electrically couple to the storage battery and a microprocessor configured to determine a dynamic parameter of the storage battery. A forcing function source is configured to apply a forcing function signal to the storage battery through the Kelvin connection. A sensor is electrically coupled to the storage battery and configured to sense an electrical response of the storage battery to the applied forcing function signal.

A tire tester is configured to receive a parameter of a tire of the vehicle. A wireless receiver can be configured to receive pressure information from a transmitter associated with a tire of a vehicle. The tire tester can include a battery tester configured to measure a parameter of a battery of a vehicle.

DETAILED DESCRIPTION OF THE PREFERRED EMBODIMENTS

The present invention includes a tire tread gauge which is configured to measure a tread of a tire of an automotive vehicle. The tire tread gauge can operate as a standalone device or it can be incorporated with the other automotive vehicle maintenance features and devices discussed herein such as an electronic battery tester. The present invention also includes an electronic battery tester for testing storage batteries in which modules can be selectively coupled to the electronic battery tester to extend the functionality of the device. In one configuration, the additional functionality is built into the device and is not carried in a module. In one configuration, the module is a tire tread gauge. In various aspects, the invention includes an electronic battery tester adapted to couple to a module, a module itself and a combination of an electronic battery tester and a module. The following is a more detailed description of the invention. However, in broad aspects, the present invention is not limited to the specific configurations or example modules set forth herein.

Figure 1:
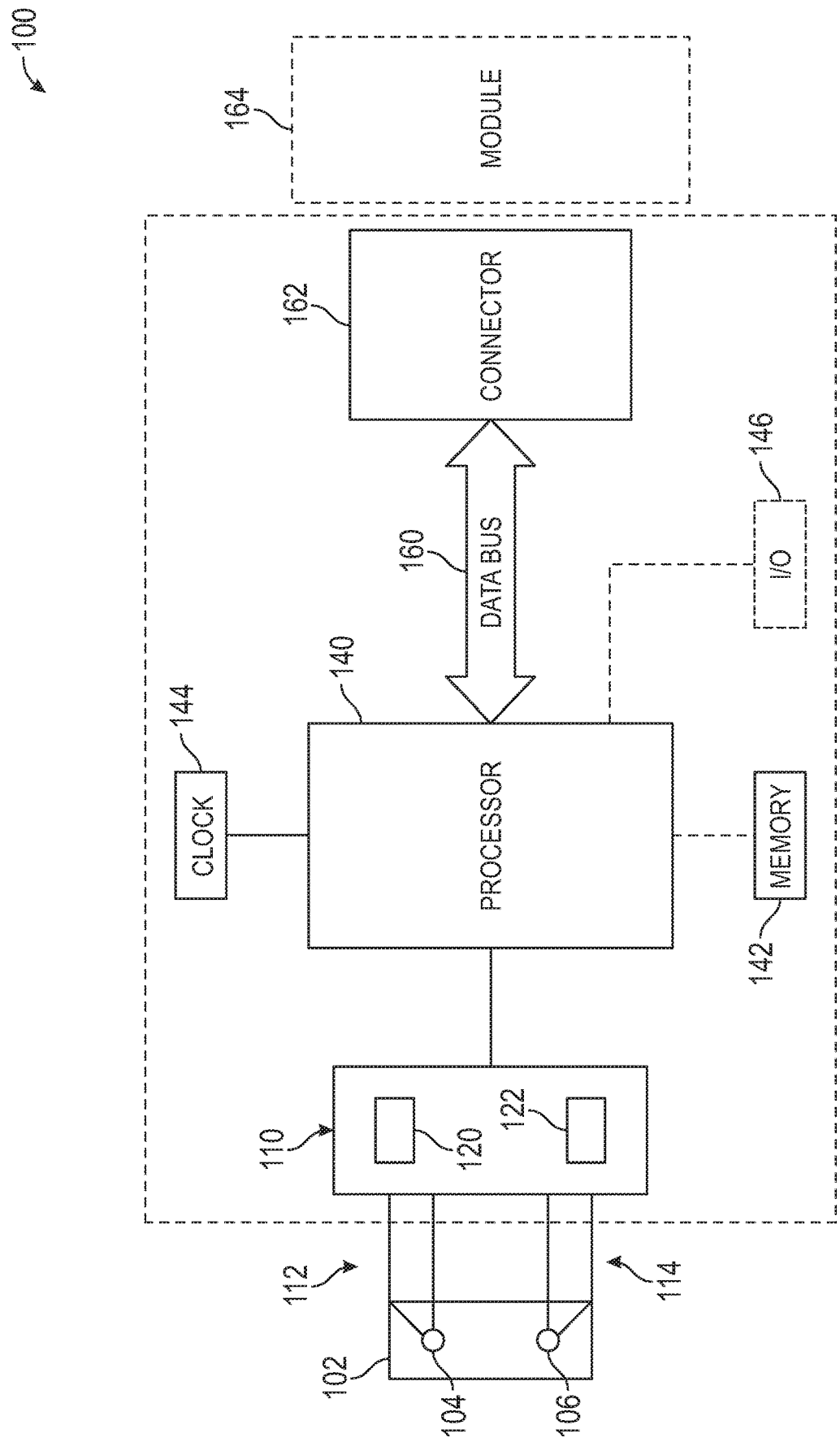
FIG. 1 is a simplified block diagram of a battery tester and a removable module.

FIG. 1 is a simplified diagram of a battery tester 100 configured to test a storage battery 102. Storage battery 102 includes terminals 104 and 106 and may comprise a single cell or a plurality of cells. Battery tester 100 includes battery test circuitry 110 which electrically couples to battery 102 to terminals 104 and 106 of battery 102 through Kelvin connections 112 and 114, respectively. In one aspect, the connection between test circuitry 110 and battery 102 can be through any appropriate means and is not limited to Kelvin connections. For example, a split Kelvin configuration, non-Kelvin connections and/or current sensors can be used. In one specific embodiment circuitry 110 includes a forcing function source 120 configured to apply a forcing function signal to battery 102 through Kelvin connections 112 and 114. In such an embodiment, circuitry 110 may also include a response sensor 122 electrically coupled to battery 102 through Kelvin connections 112, 114. The response sensor 122 is configured to sense an electrical response of battery 102 to the applied forcing function signal. The forcing function signal includes a time varying component and can be applied either by injecting a signal or selectively applying a load to the battery 102.

A digital processor 140 is electrically coupled to circuitry 110 and is configured to test the storage battery 102. Processor 140 operates in accordance with instructions stored in some type of a memory 142 and at a rate determined by clock 144. In one specific embodiment, processor 140 measures a dynamic parameter of battery 102. An optional input/output (I/O) 146 is provided for coupling to other equipment and/or for operation by a user.

In accordance with the present invention, a data bus 160 is provided which couples processor 140 to a connector 162. The data bus 160 can carry digital or analog data along with analog signals or electrical power as desired. Connector 162 is configured to couple to a removable module 164 which can be selectively coupled to battery tester 100 to add functionality to battery tester 100.

Figure 2:
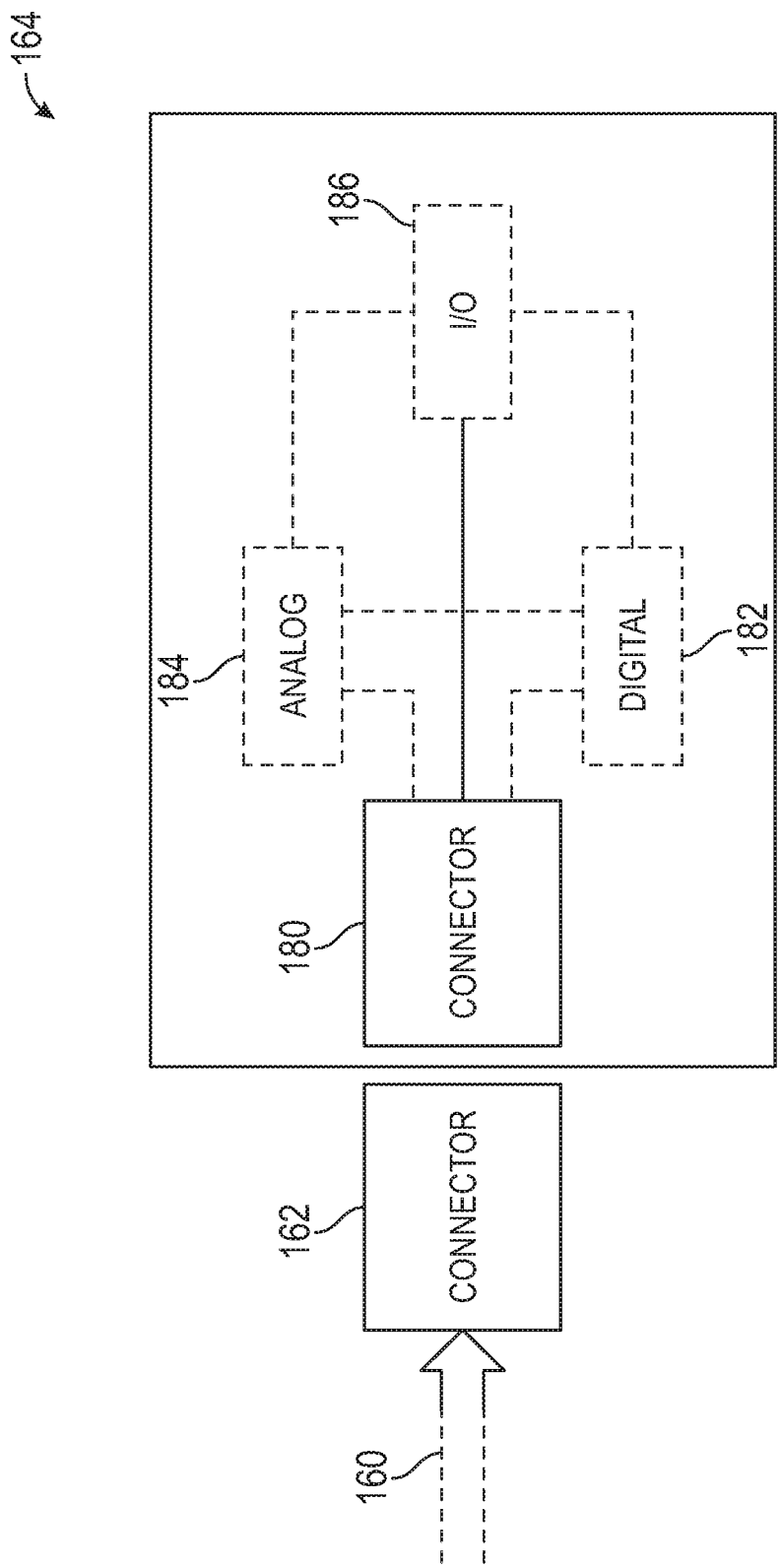
FIG. 2 is a more detailed block diagram of the removable module shown in FIG. 1.

FIG. 2 is a simplified block diagram of one example of a removable module 164 and shows various component blocks which can be included in module 164. Module 164 includes a connector 180 configured to mate with connector 162 of battery tester 100 and thereby provide a connection to data bus 160. In one aspect, optional digital circuitry 182 is provided and coupled to data bus 160 through connectors 180 and 162. Similarly, in another example aspect, optional analog circuitry 184 is provided and can also couple to data bus 160 through connectors 180 and 162. Another optional circuit is illustrated as input/output circuit 186 which can couple to data bus 160 through connectors 180 and 162. Removable module 164 can include any combination of circuits 182, 184 and 186. Further, these circuits can optionally interconnect with one another.

Figure 3:
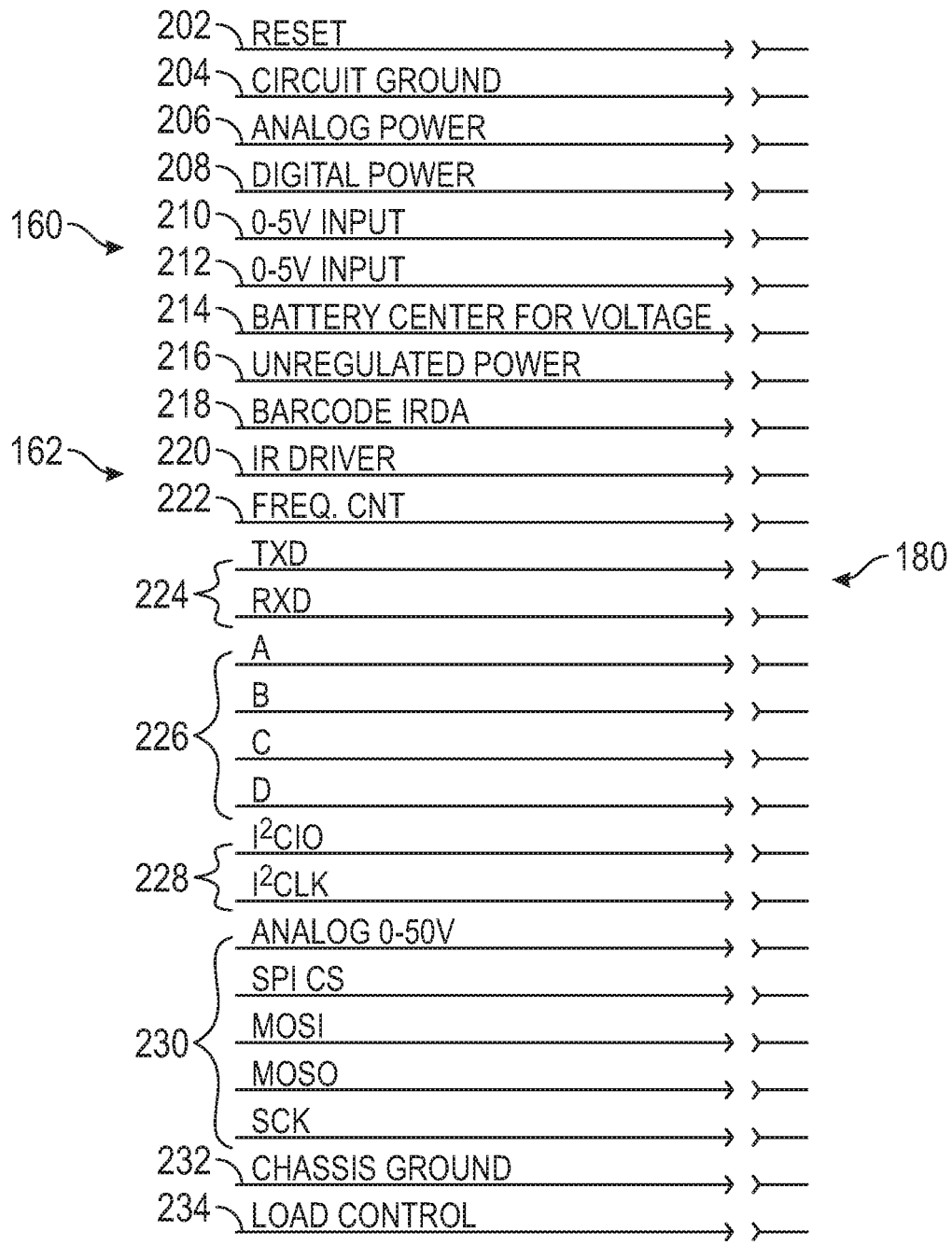
FIG. 3 is an electrical schematic diagram showing electrical lines or connections in the connector which couples the battery tester to the removable module illustrated in FIG. 1.

FIG. 3 is an electrical diagram showing specific electrical connections provided in one embodiment of connectors 162 and 180. These connections are shown for example only and the present invention is not limited to this particular configuration. The electrical connections shown in FIG. 3 form the data bus 160 illustrated in FIGS. 1 and 2.

A reset connection 202 carries a reset signal between battery tester 100 and module 164 such that either unit can cause a reset to occur in the other. This is useful if one of the units is not responding. Line 204 carries a circuit ground while lines 206 and 208 carry analog and digital power, respectively, from the battery tester 100 to the module 164.

Lines 210 and 212 provide analog inputs from module 164 to battery tester 100. In a specific example, these inputs can range between 0 and 5 and can be configured to represent a variable in an analog format. Line 214 carries a battery center voltage connection and is used to couple to a center terminal of a multi-terminal battery. Unregulated power is provided on line 216. A bar code/IRDA connection is provided on line 218 and an IR driver connection is provided on line 220. The bar codes/RDA connection can be used to receive data from module 164 and the IR driver line 220 can be used to send data to an external device, such as a printer, through module 164.

A frequency count line 222 is provided for transferring data relating to frequency. TXD and RXD lines are provided on a serial connection 224 for transferring data serially between module 164 and battery tester 100. Connectors 226 provide a connection through Kelvin connectors 112 and 114 and are identified as A, B, C and D. This allows module 164 to have direct access to the Kelvin connectors 112 and 114.

A two-line data bus connection 228 is provided in accordance with the I²C standard for bi-directional communication between battery tester 100 and module 164. Additionally, five lines are provided for a data bus 230 which operates in accordance with the SPI standard for data communication between battery tester 100 and module 164. A chassy ground is provided on line 232 and a load control is provided on line 234. Load control line 234 is used to control application of a load contained in module 164.

The example data bus 160 shown in FIG. 3 provides a number of different electrical connections for sending signals between tester 100 and module 164. Depending on the particular signal lines being employed, tester 100 and module 164 should be configured appropriately. For example, if a serial bus 224 is used, processor 140 of battery tester 100 and digital circuitry 182 from module 164 should have appropriate circuitry to interface with such a serial connection.

In one embodiment, module 164 comprises a standard battery tester interface. For example, such an interface can provide a direct passthrough connection with no electronics itself and a standard battery interface is built into the main tester body.

In another example, module 164 comprises a 42 volt battery tester interface. In such an embodiment, the interface can provide voltage and/or conductance scaling by adjusting amplifiers and/or divider networks to scale a 42 volt input voltage, or other measurements such that they can be used with a standard battery tester interface. This allows a single test circuit to be used with differing battery types by scaling applied signals and/or measured values. This is not limited to the measurement of 42 volt batteries and can be applied to other battery sizes. In general, the battery test module can include circuitry which can scale a measurement.

Module 164 can comprise a hybrid vehicle interface. For example, instead of scaling a 42 volt battery voltage, a much high voltage can be scaled such as those present in hybrid vehicles, for example 250 to 400 volts.

Module 164 can comprise an OBDII connector such that battery tester 100 can access the OBDII data bus of a vehicle. In another example, module 164 comprises a multimeter to thereby add such functionality to battery tester 100. In such an example, Kelvin connectors 112 and 114 can be used to provide signals to module 164 through connection 226. The signals can be digitized using digital circuitry 182. This information is provided back to processor 140 and displayed or output on I/O 146. For example, voltage resistance or current can be measured. In a similar example, module 164 provides an oscilloscope function.

Communication functions can be provided through module 164 such as radio frequency or infrared and other wired or wireless communication I/O. For example, module 164 can provide an interface to a printer. In another example, module 164 includes a printer such that information can be printed directly.

Module 164 can include a memory which carries specific software to add additional software functionality to battery tester 100. Data security, encryption or software unlocking keys can also be provided by a memory in module 164.

Module 164 can include calibrated values such that specific calibrations can be performed on battery tester 100. For example, a calibration reference can be coupled to the tester 100. The value of the reference can be digitally communicated to the tester 100.

Module 164 can include additional processing circuitry to further process battery test data.

In one embodiment, analog circuitry 184 includes a large resistive load which can optionally be applied to battery 102 during a test. The load is configured to draw a large amount of current for performing a load test.

Removable module 164 can also provide a backup battery connection for operating circuitry of battery tester 100. A barcode reader can be included in module 164 such that module 164 can be used to read bar code information, for example on a vehicle or on a battery. This information can be used by the battery tester 100 or stored for future use. A data port can be included in module 164, such as a USB port or a PCMCIA port. This allows the battery tester 100 to couple to widely available modular devices used with personal computers. The module 164 may contain additional memory for storage or data logging or a real time clock.

Module 164 can also contain circuitry or stored algorithms for performing additional tests such as testing the alternator of a vehicle or the starter, etc.

Figure 4A:
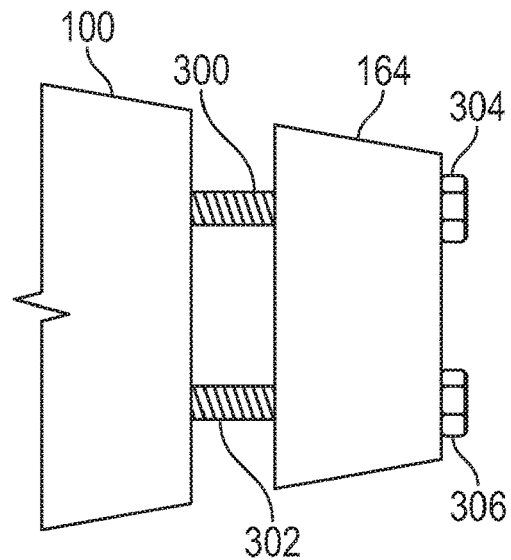
FIGS. 4A, 4B and 4C show couplings between the battery tester and removable module.
Figure 4B:
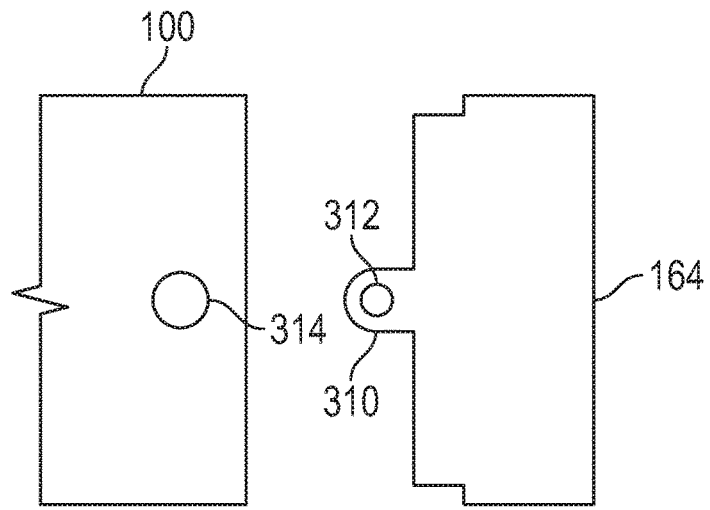
Figure 4C:
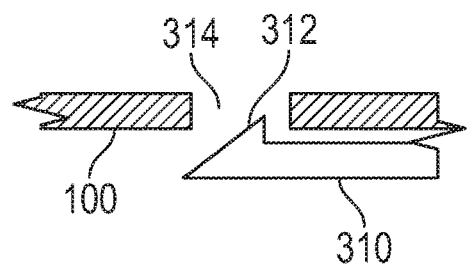

Removable module 164 can be coupled to measure battery tester 100 using any appropriate technique. For example, FIG. 4A is a side view showing battery test module 164 coupling to battery tester 100 through screws 300 and 302. Finger grips 304 and 306 can be used to manually tighten the screws 300, 302, respectively, by an operator. FIG. 4B is a side view shown another attachment technique in which a spring loaded members 310 includes a protrusion 312 which fits into a receptacle 314. A more detailed view is shown in the cross-sectional view of FIG. 4C. Other attachment techniques include separate screws or attachment elements, snap fit techniques, etc. The mechanisms can be separate elements, molded into the cases of battery tester 100 and/or removable module 164, etc.

In one configuration, the module 164 is used to provide any number of different types of secondary functionality to the battery tester 100. The module 164 can be removably coupled to a connector, or can be spaced apart from the battery tester and communicate using wireless techniques, or can be contained internally to the tester 100.

In one specific configuration, the module 164 is used to measure various parameters of tires of a vehicle. For example, the module 164 can include a depth gauge used to determine remaining life of tires. The depth gauge can be mechanical, optical or use other techniques. The module can also include an air pressure gauge which is coupled to a valve of the tire to provide an electrical output. In some newer vehicles, tire pressure sensors are carried with the tire or wheel and provide a wireless output, such as a RF signal.

In such a configuration, the module 164 can be configured to receive the tire pressure information over the wireless connection.

Other example sensors which can provide secondary functionality include a brake pad wear sensor, a brake rotor wear sensor, a fluid level sensor, an exhaust emission sensor, temperature sensors, etc. In various configurations, the sensors can either plug into the battery tester 100, be built into the tester, be wired to it by a cable, or communicate wirelessly using, for example, infrared or radio frequency. In one configuration used for measuring parameters of a tire, the sensor can include a means to encode which tire is being read. For example, buttons can be used to indicate left front, right front, left rear and right rear tire of the vehicle so that the readings can be correlated to the correct tire pressure. The data may be merged with battery data or be used independently. In another example, the data can be encoded into an audit code. In such a configuration, the data is encoded in a manner to reduce fraudulent manipulation of the data. The data can be stored locally, for example on a temporary memory such as a flash card, or can be transmitted to a remote location such as a point of sale. Example transmission techniques include wireless techniques such as infrared or radio frequency, and any appropriate protocol including for example, TCP/IP.

The data read back from the sensor can be compared against limits and used to trigger alarms. The limits can be based upon the type of vehicle being examined or based on other criteria. Additionally, data collected following maintenance can be compared with data collected prior to performing maintenance. For example, vehicle information can be stored in a memory which relates to the proper tire inflation pressure(s) for a specific vehicle or tire. The vehicle type can be input using, for example, a manual input or the like. The stored data can be in the form of a simple look-up table. In addition to the tire pressures being based upon vehicle type, the specific type and manufacturer of a tire can also be used and data stored related to proper tire inflation.

In vehicles which include circuitry for monitoring tire pressures, and where the tire pressures must be different between the front and the back tires, the test system must be able to identify which pressure data came from which tire. In another aspect of the present invention, the tester 10 can communicate with circuitry in the vehicle to correlate where each of the pressure sensors are located. This is important, for example, if the tires are rotated. The communication to circuitry in the vehicle can be through, for example, an onboard data bus connection such as OBDII.

Various types of tire measurement instruments have been used. These include an electronic pressure gauge with a digital readout, a mechanical tread depth gauge, an electronic tread depth gauge, for example, using a laser. In one aspect, the present invention provides a combination mechanical tire pressure sensor and mechanical tire depth gauge, or a combination digital pressure sensor and mechanical depth gauge.

In one aspect, the present invention includes a combined tire pressure and tire temperature measurement test device, a combined electronic pressure and electronic tread depth gauge test device, a combined temperature, pressure and depth gauge, a standalone tire tread depth gauge or a tire depth gauge incorporated into a battery tester, any of which may or may not include the ability to print or wirelessly communicate. For example, such a tester can wirelessly communicate with a RF equipped battery tester, and/or can print wirelessly using, for example, an infrared communication link to a printer. The tire tester can include an air pressure sensor for coupling to a valve stem on a tire. Examples of electronic tread depth sensors include a spring-loaded shutter that selectively uncovers sequencing LED's, a light sensor detects which LED's are exposed and converts this information to depth or an image capture device. An infrared temperature sensor can be used to measure the side wall temperature of a tire which can then be used to properly interpret the tire pressure data.

In a configuration in which the tire tester includes a user output, instructions can be provided to step the operator through the various tires of the vehicle, for example, left front, right front, right rear and left rear. In another example, if user input is provided, the operator can provide an indication of which tire is being tested. A user input can also be used to initiate a particular test. Tests can be selected individually, or an automatic sequence can be initiated which steps an operator through the various tests. Collected data can be stored within the tire tester, or can be communicated remotely using wired or wireless communication techniques. The information can also be provided to a printer. Additionally, the data collected during the testing can be displayed and/or reviewed if the device includes a display. The collected data can also be stored in a non-volatile memory such as an EEPROM for later recovery. In order to conserve battery power, the system can be configured to automatically turn off after a period of non-use. In order to assist the operator, a light source can be coupled to the device for use in illuminating various parts of the tire, for example the valve stem or tread. Units can be selectable, for example English, metric, PSI, kPa, inches and millimeters. In some configurations, the tire tester can wirelessly receive tire pressure data from an imbedded pressure sensor carried in some modern vehicles.

Figure 5:
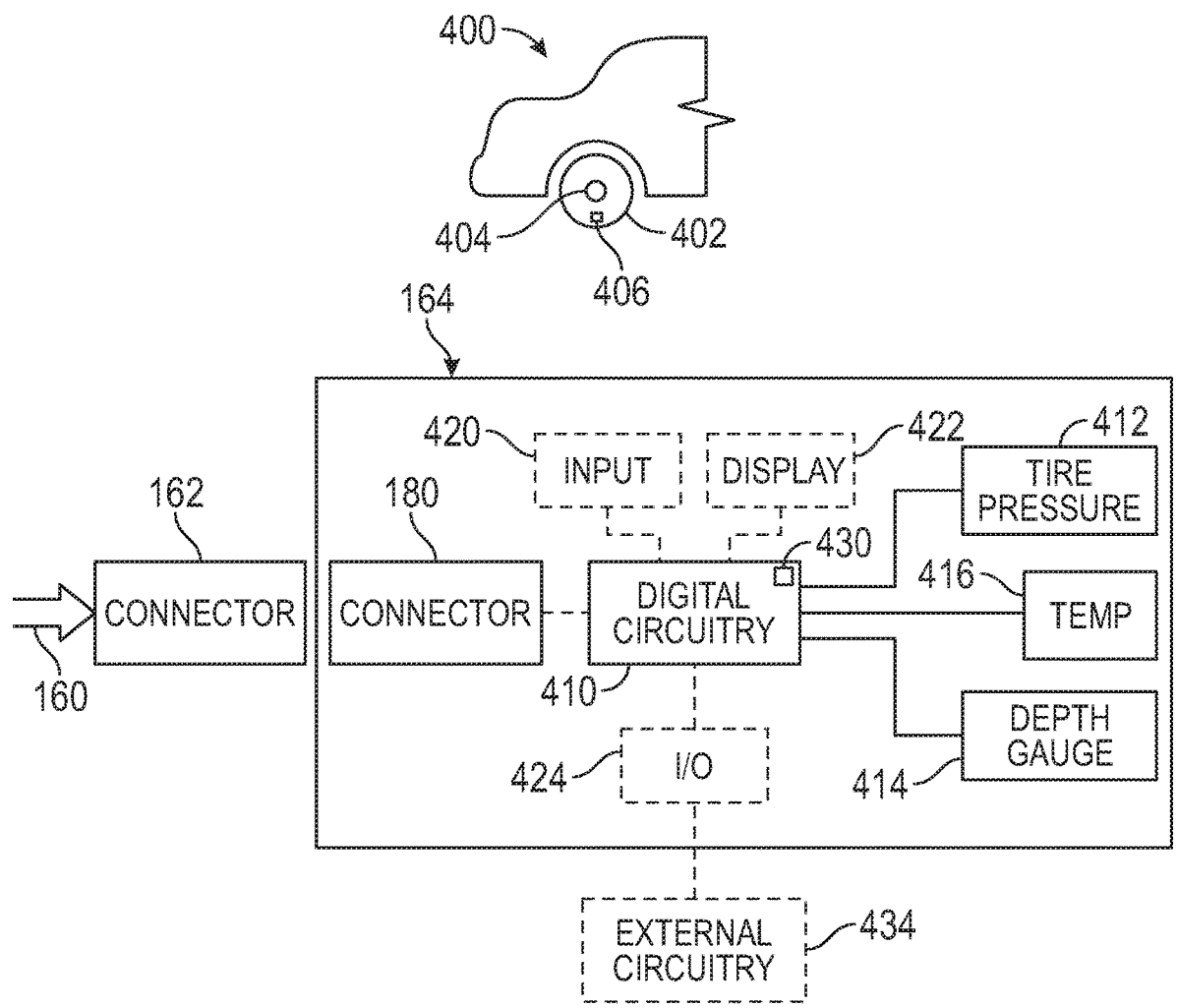
FIG. 5 is a diagram showing a module and an automotive vehicle.

FIG. 5 is a simplified diagram showing module 164 adjacent vehicle 400. Vehicle 400 includes one or more tires 402 which may include a valve 404 for filling tire with air. Tires (wheels) 402 may also include internal pressure sensors 406 which can wirelessly transmit pressure information. Module 164 is configured for operation as discussed above and includes some type of digital circuitry 410 along with a tire pressure input 412 and/or a tread depth gauge input 414. Tire pressure input 412 and tread depth gauge input 414 can operate using any of the techniques discussed above and can comprise sensors which are directly coupling to tire 402, or can comprise inputs for receiving information either wired or wirelessly. Digital circuitry 410 can comprise any type of digital circuitry and may include a microprocessor or the like.

FIG. 5 also illustrates an optional input 420 and an optional display or other type of output 422. Input 420 can be, for example, a manual input such as a keypad, push button or the like and display 422 can be configured for displaying information locally to an operator. Input/output circuitry 424 is also shown as an option in FIG. 5 and can comprise, for example, circuitry for coupling to a communication network, wired or wireless communication circuitry, etc. The digital circuitry 410 can include memory 430 for containing program instructions for implementing software in accordance with the techniques discussed herein. Memory 430 can also be used for storing other types of information. The input/output circuitry 424 is illustrated as coupling to optional external circuitry 434 which can comprise, for example, other digital equipment including a printer for printing test results. In some configurations, module 164 receives power through connectors 162 and 180. In another example configuration, module 164 includes an internal power source such as a battery. Module 164 can also operate as a standalone device and does not require connection to an external battery tester. In such a configuration, connector 180 is not required. Module 164 also includes an optional temperature input 416 which can comprise, for example, a temperature sensor or an input for receiving temperature information.

Figure 6:
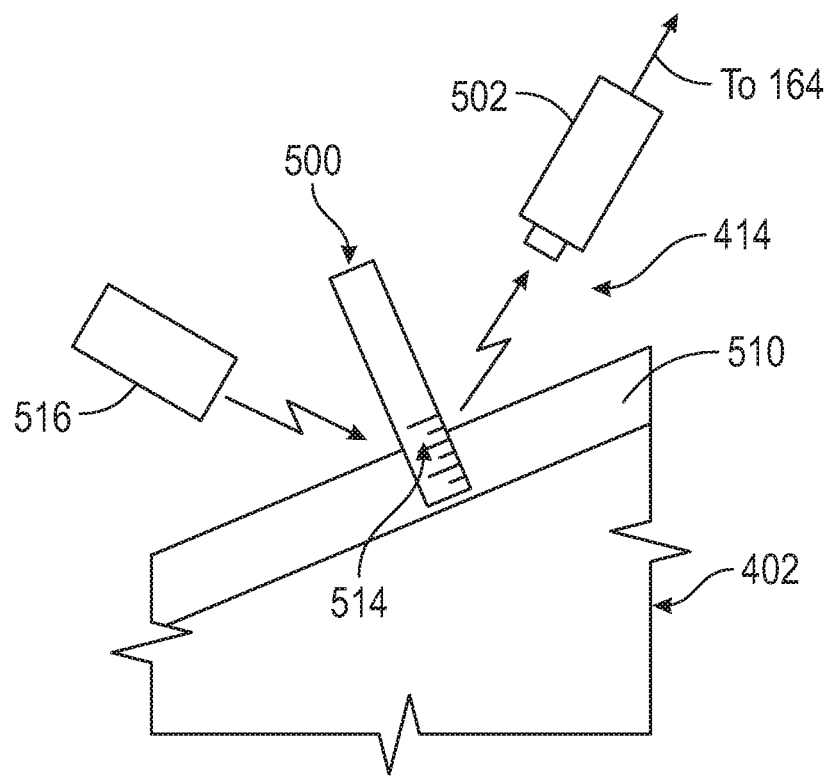
FIG. 6 is a side cross-sectional view showing an elongate element of a tire tread gauge inserted adjacent to a tread of a tire.

In one configuration, the depth gauge 414 includes an elongate element 500 (see FIG. 6) similar to a gauge which can be inserted into a tread 510 of the tire 402. The depth gauge 414 can include visual markings 514, such as different colors, numerical markings or other indicia which are indicative of tread depth. In such a configuration, the depth gauge 414 includes a camera 502 or other optical input circuitry allowing a picture to be taken of the element 500 when placed into the tire tread 510. This can be stored for archival purposes, transmitted to another location, or otherwise interpreted for use in determining tread depth. In one configuration, the digital circuitry 410 performs image processing on the collected image in order to ascertain tread depth. A collection of the image can be triggered by an operator using input 420, or can be performed automatically in a manner similar to a bar code scanner in which the digital circuitry 410 recognizes an image in which the depth gauge has been placed into the tread. Images can be stored in memory 430. When the change between two or more images is negligible, it can be assumed that element 500 is not moving and has been completely inserted into tread 510.

The processing of the image can be performed locally within the module 164 or it can be performed remotely by transmitting the information to a remote location. For example external circuitry 434 can be circuitry such as computer equipment located at a remote location or with a central server, in the cloud, etc. The collected images can be stored temporarily or permanently in memory 430. The image processing can be configured to identify the visual markings 514 in order to determine the depth of the tread 510 of tire 402. An optional illumination source 516 can be provided to illuminate the visual markings 514 on the elongate element 500 to assist in providing more accurate depth measurements.

The collected image(s) can be used for auditing purposes to ensure that a measurement has been made and properly interpreted. For example, the images can be associated with information entered or received from input 420, such as information which identifies the vehicle under test, the service personnel performing the test, the type of tire being measured, location information, date and time information, etc. This allows collected images to be reviewed and audited at a subsequent time and used to prevent warranty fraud, ensure that the device is being used appropriately and that accurate measurements are being obtained.

In the US, for example, tire depth is measured in $\frac{1}{32}$" increments. $\frac{2}{32}$ of an inch and below is considered dangerous under all conditions and means the tire should be replaced immediately. Above $\frac{2}{32}$ and below $\frac{4}{32}$, the tire's performance will be reduced in certain conditions such as rain, snow, etc., and it is recommended the tire should be replaced as soon as practical. Tires with more than $\frac{4}{32}$ are considered acceptable for service.

In one specific configuration, the bottom $\frac{2}{32}$ of the element 500 is red, the next $\frac{2}{32}$ section is yellow, and above that green. When inserted into the bottom of the tread groove 510, if any red is showing, REPLACE the tire. If any yellow is showing, REPLACE SOON. This information can be recorded in the memory 430 and provided as an output using, for example, display 422. In addition to color changes, there can also be contrasting tic marks added for finer resolution.

In one simple implementation, a picture will be taken with the portable battery tester 164 and recorded in memory 430 with the test record and/or shown to the customer.

Pairs of photos can be taken, with one at a distance to record which position on the vehicle the gauge is located, followed by a close up to show the depth. Additional images can also be obtained to record addition information related to the testing procedure, vehicle, tire, environment, etc. Image processing can be done on the collected images such that the tester can calculate the tread depth to include in the report or show to the customer.

Depending on the results, recommendations can be made to the customer about appropriate actions to take: replace now, replace in x months or y miles, etc. This information can be calculated using algorithms based upon straight line approximations, curve fitting, wear rate for particular tires, driving conditions, etc. and can be calculated, for example, using digital circuitry 410. Further analysis can be performed after checking all four tires 402 and observing if there is a significant miss-match between thread depths which should be corrected. This information can be used to identify misaligned tires or other problems associated with the drivetrain and suspension of the vehicle.

The lower end of the element 500 (and subsequent color stripes and tics) can be fabricated with a slight radius to follow the curvature of an "average" tire. This allows the element 500 to be better seated in the tire 402 for more accurate depth measurements. The element 500 can be made of card stock, laminated card stock, plastic, etc.

A holder for the element 500 can be fabricated for, or an integral part of, the gauge such that it can "self-stand" at the top of the tire without the technician holding it to ease the measurement process. Alternatively, the gauge could be sufficiently thick (less than minimum tread spacing, for example) and wide with a large curvature, and short, such that it can "self-stand" without any additional mechanism.

An attachment mechanism can be provided such as Velcro, magnet, pocket, etc., that provides convenient storage with the battery tester 164. A slot can be provided in the battery tester 164 such that the element 500 can be slid into the housing of the battery tester 164. The element 500 can also be tethered to the battery tester 164 to prevent loss of element 500.

If it is recommended that a tire should be replaced, recommendations can be provided of appropriate tires for that vehicle (based on vehicle information previously entered such as from VIN, make/model/year, etc.) that are in stock, on sale, etc., or some other promotional means. Such information can be stored in memory 430 or received from an external source such as through input 420.

The camera 502 can also be used to photograph a sidewall of the tire 402 to determine manufacturer, model, series, size etc. provided enough contrast is provided. This information can be associated with a tread wear profile, used to select a replacement tire, used for record keeping, or for some other purpose.

The element 500 can be stored in a slot or other opening in the housing of the device 164. In another example configuration, the element 500 can be attached to the device 164 and deployed as needed. For example, the gauge can be spring loaded and activated by an operator pressing a button. In another example, the element 500 is hinged such that it can be folded out of the housing of the module 164 and inserted into the tread 510. In such a configuration, the camera 502 should be oriented such that it is pointing towards the element 500 and specifically the portion of the element 500 which is inserted into the tread 510 when the element 500 is deployed.

Although the present invention has been described with reference to preferred embodiments, workers skilled in the art will recognize that changes may be made in form and detail without departing from the spirit and scope of the invention. In various configurations, module 164 includes no digital circuitry and tire pressure sensor 412 and depth gauge 414 are both mechanical devices. In another configuration, pressure sensor 412 is an electronic device and depth gauge 414 is a mechanical device.

What is claimed is:

1. An electronic battery tester for testing a storage battery comprising:
    a Kelvin connection configured to electrically couple to the storage battery of a vehicle;
    a microprocessor configured to determine a dynamic parameter of the storage battery;
    a forcing function source configured to apply a forcing function signal to the storage battery through the Kelvin connection;
    a sensor electrically coupled to the storage battery and configured to sense an electrical response of the storage battery to the applied forcing function signal;
    a tire tread gauge arranged to be inserted into a tread of a tire of the vehicle, the tire tread gauge including a visual indicator indicative of a depth; and
    an image capture device configured to capture an image of the tire tread gauge when the tire tread gauge is inserted into a tread of a tire;
    wherein the microprocessor is further configured to determine a tire tread depth based upon an image of the tire gauge when the tire gauge is inserted into the tread of the tire based upon the captured image of the visual indicator indicative of the depth.

2. The apparatus of claim 1, wherein the tire tread gauge is spaced apart from the microprocessor.

3. The apparatus of claim 1, wherein the tire tread gauge includes a tire pressure sensor.

4. The apparatus of claim 1 including an output configured to send data to a printer.

5. The apparatus of claim 1 including a user input is configured to receive information identifying the tire undergoing testing.

6. The apparatus of claim 1 including a database configured to couple to the electronic battery tester.

7. The apparatus of claim 1 wherein the tire tread gauge includes a display configured to prompt an operator to test a specific tire of the vehicle.

8. The apparatus of claim 1 including an input configured to receive information related to tire pressure specifications for the vehicle.

9. The apparatus of claim 1 wherein a measured tire parameter is sent to a point of sale device.

10. The apparatus of claim 1 including a display configured to display information related to tire tread depth.

11. The apparatus of claim 1 wherein the image is stored in a memory.

12. The apparatus of claim 1 wherein the image is transmitted to a remote location.

13. The apparatus of claim 1 wherein a plurality of images are collected.

14. The apparatus of claim 1 wherein a plurality of images are stored in a memory and used for auditing purposes.

15. The apparatus of claim 1 wherein the visual indicator comprises a plurality of different colors.

16. The apparatus of claim 1 including an output which provides an indication of remaining tire life based upon the captured image.

17. The apparatus of claim 1 including an input configured to receive information related to the vehicle and an output related to tire condition based upon the captured image and the received information.

18. The apparatus of claim 1, wherein the tire tread gauge includes a tire temperature sensor.

19. The apparatus of claim 18 wherein a pressure measurement of the tire is adjusted based upon the tire temperature.

20. The apparatus of claim 1, wherein the tire tread gauge includes a receiver configured to receive tire pressure data from a pressure sensor coupled to the tire of the vehicle.

21. The apparatus of claim 20 wherein the receiver is configured to receive tire pressure data over a wireless connection.

22. The apparatus of claim 1 wherein the tire tread gauge includes memory to store data.

23. The apparatus of claim 22 including an output configured to output data stored in the tire tread gauge memory.

24. The apparatus of claim 13 wherein the microprocessor uses the plurality of images to identify when the tire tread gauge has been placed into the tire tread.

25. The apparatus of claim 24 wherein the microprocessor identifies a time when a change between two or more images is indicative of the tire tread gauge not moving and that it has been completely inserted into the tire tread.

26. The apparatus of claim 1 wherein the image capture device is further configured to capture an image of a sidewall of the tire and responsively identify tire parameters.

27. The apparatus of claim 26 including an output which provides information related to a condition of the tire based upon the captured image and the identified tire parameters.

* * * * *